(12) United States Patent
Okumura et al.

(10) Patent No.: US 8,987,117 B2
(45) Date of Patent: Mar. 24, 2015

(54) SEMICONDUCTOR OPTICAL INTEGRATED DEVICE AND METHOD FOR FABRICATING THE SAME

(71) Applicant: Fujitsu Limited, Kawasaki-shi, Kanagawa (JP)

(72) Inventors: Shigekazu Okumura, Kawasaki (JP); Mitsuru Ekawa, Isehara (JP); Shuichi Tomabechi, Atsugi (JP); Ayahito Uetake, Isehara (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/966,592

(22) Filed: Aug. 14, 2013

(65) Prior Publication Data
US 2013/0330867 A1 Dec. 12, 2013

Related U.S. Application Data

(60) Division of application No. 13/611,099, filed on Sep. 12, 2012, now Pat. No. 8,565,279, which is a continuation of application No. PCT/JP2011/050326, filed on Jan. 12, 2011.

(30) Foreign Application Priority Data

Mar. 29, 2010 (JP) .................................. 2010-074204

(51) Int. Cl.
*H01L 21/20* (2006.01)
*H01S 5/20* (2006.01)
(Continued)

(52) U.S. Cl.
CPC ............... *H01S 5/2081* (2013.01); *B82Y 20/00* (2013.01); *H01S 5/0265* (2013.01);
(Continued)

(58) Field of Classification Search
CPC .............................. H01L 29/06; H01L 21/00
USPC ................. 438/478, 31; 257/632; 385/12–16, 385/128–132, 31, 37, 40, 50
See application file for complete search history.

(56) References Cited

U.S. PATENT DOCUMENTS 5,459,747 A 10/1995 Takiguchi et al.
6,411,765 B1 * 6/2002 Ono .............................. 385/131
(Continued)

FOREIGN PATENT DOCUMENTS

JP 05-251812 9/1993
JP 07-038204 2/1995
(Continued)

OTHER PUBLICATIONS

Japanese Office Action issued for Japanese Patent Application No. 2010-074204 dated Jan. 21, 2014.
(Continued)

*Primary Examiner* — Yuanda Zhang
*Assistant Examiner* — Sheikh Maruf
(74) *Attorney, Agent, or Firm* — Kratz, Quintos & Hanson, LLP

(57) ABSTRACT

A semiconductor optical integrated device includes a first semiconductor optical device formed over a (001) plane of a substrate and a second semiconductor optical device which is formed over the (001) plane of the substrate in a (110) orientation from the first semiconductor optical device and which is optically connected to the first semiconductor optical device. The first semiconductor optical device includes a first core layer and a first clad layer which is formed over the first core layer and which has a crystal surface on a side on a second semiconductor optical device side that forms an angle θ greater than or equal to 55 degrees and less than or equal to 90 degrees with the (001) plane.

5 Claims, 25 Drawing Sheets

(51) Int. Cl.
  *B82Y 20/00*  (2011.01)
  *H01S 5/026*  (2006.01)
  *H01S 5/32*  (2006.01)
  *H01S 5/022*  (2006.01)
  *H01S 5/12*  (2006.01)
  *H01S 5/22*  (2006.01)
  *H01S 5/343*  (2006.01)

(52) U.S. Cl.
  CPC .......... *H01S 5/3211* (2013.01); *H01S 5/02288* (2013.01); *H01S 5/12* (2013.01); *H01S 5/2201* (2013.01); *H01S 5/3202* (2013.01); *H01S 5/34306* (2013.01); *H01S 5/026* (2013.01)
  USPC ....................................................... 438/478

(56) References Cited

U.S. PATENT DOCUMENTS

| | | | |
|---|---|---|---|
| 2005/0201707 A1* | 9/2005 | Glebov et al. | 385/132 |
| 2009/0225804 A1* | 9/2009 | Sasahata et al. | 372/45.01 |
| 2009/0245726 A1* | 10/2009 | Yonekura et al. | 385/14 |
| 2009/0267195 A1* | 10/2009 | Kato | 257/623 |
| 2010/0061679 A1* | 3/2010 | Hayashi et al. | 385/14 |
| 2010/0067861 A1* | 3/2010 | Choki et al. | 385/131 |
| 2010/0086255 A1* | 4/2010 | Ishizaka | 385/31 |
| 2010/0316343 A1* | 12/2010 | Yamamoto | 385/129 |
| 2012/0039563 A1* | 2/2012 | Shibata et al. | 385/14 |
| 2012/0183009 A1* | 7/2012 | Adachi et al. | 372/99 |
| 2013/0170803 A1* | 7/2013 | Mori et al. | 385/124 |
| 2014/0105556 A1* | 4/2014 | Heideman et al. | 385/131 |

FOREIGN PATENT DOCUMENTS

| | | |
|---|---|---|
| JP | 09-064463 | 3/1997 |
| JP | 09-293927 | 11/1997 |
| JP | 2001-189523 A1 | 7/2001 |
| JP | 2002-217446 A1 | 8/2002 |
| JP | 2002-243946 A1 | 8/2002 |
| JP | 2002-314192 A1 | 10/2002 |
| JP | 2002-324936 A1 | 11/2002 |
| JP | 2003-174224 A1 | 6/2003 |
| JP | 2004-273993 A1 | 9/2004 |
| JP | 2007-201072 A1 | 8/2007 |
| JP | 2008-53501 A1 | 3/2008 |
| JP | 2008-71906 * | 3/2008 |
| JP | 2008-71906 A1 | 3/2008 |
| JP | 2009-054721 A | 3/2009 |
| JP | 2010-010284 * | 1/2010 |
| JP | 2010-10284 A1 | 1/2010 |

OTHER PUBLICATIONS

Office Action issued for counterpart Japanese Patent Application No. 2010-074204 issued on Aug. 5, 2014, with translation of relevant part: p. 1 line 18 to p. 2 line 13 and p. 2 line 17 to p. 3 line 1.

International Search Report for International Application No. PCT/JP2011/050326 dated Apr. 12, 2011.

Chinese Office Action with English translation for Chinese Application No. 201180017099.0 dated Dec. 2, 2014.

* cited by examiner

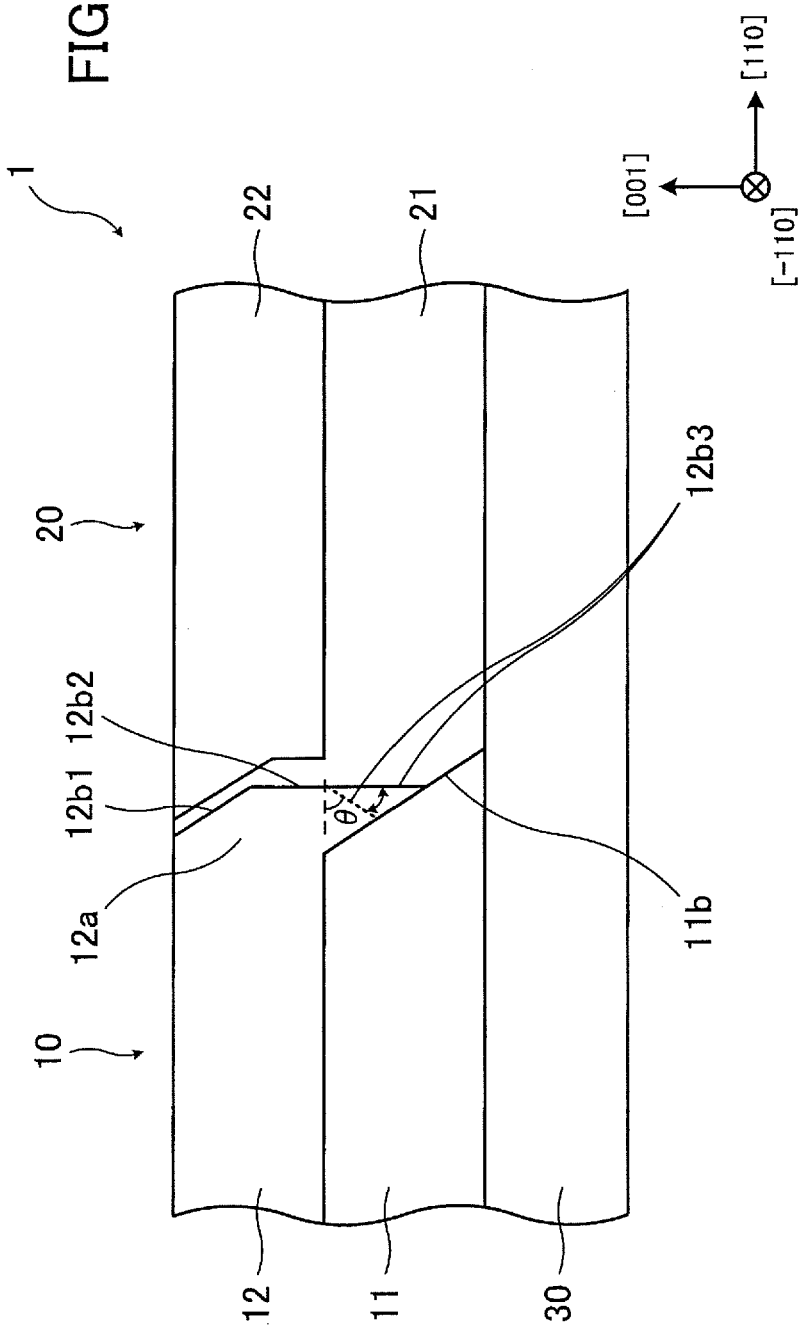

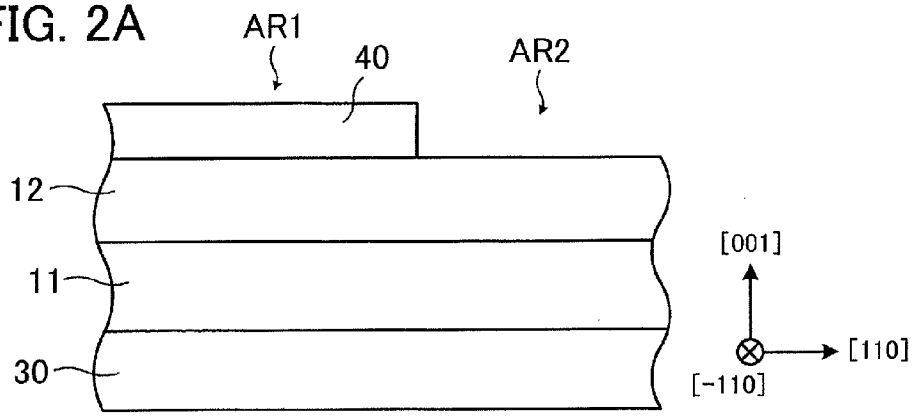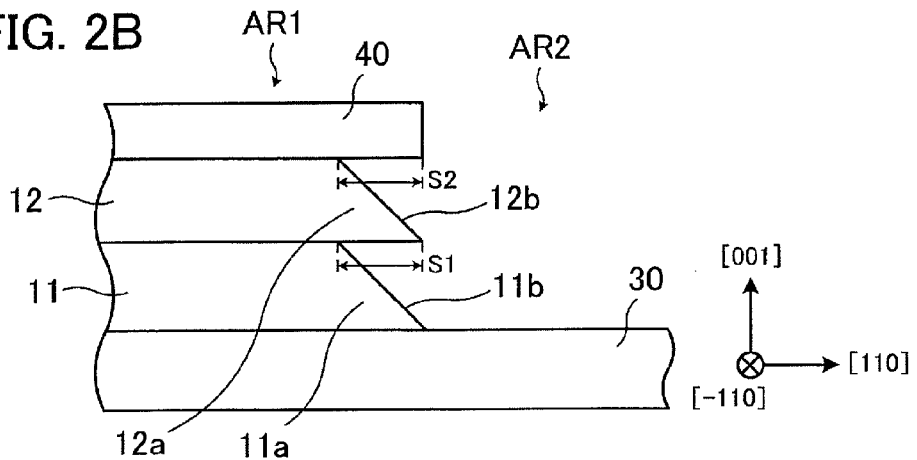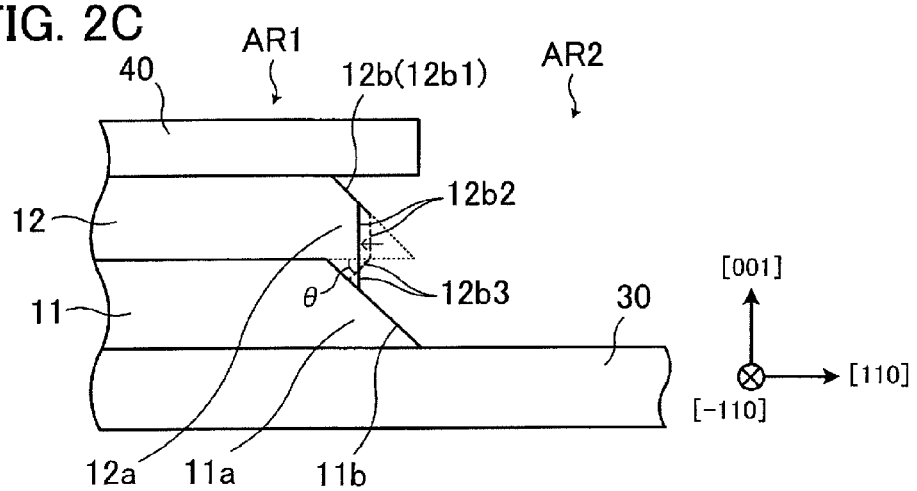

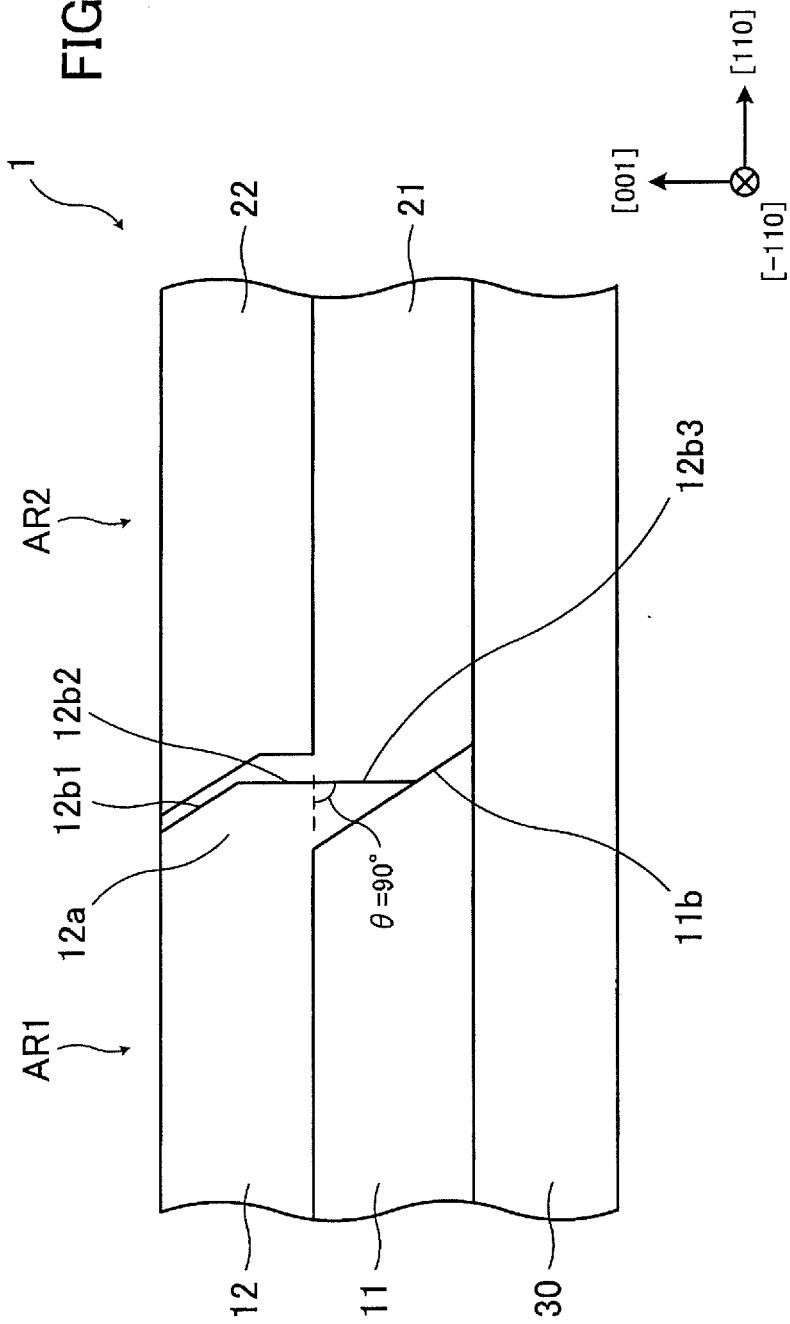

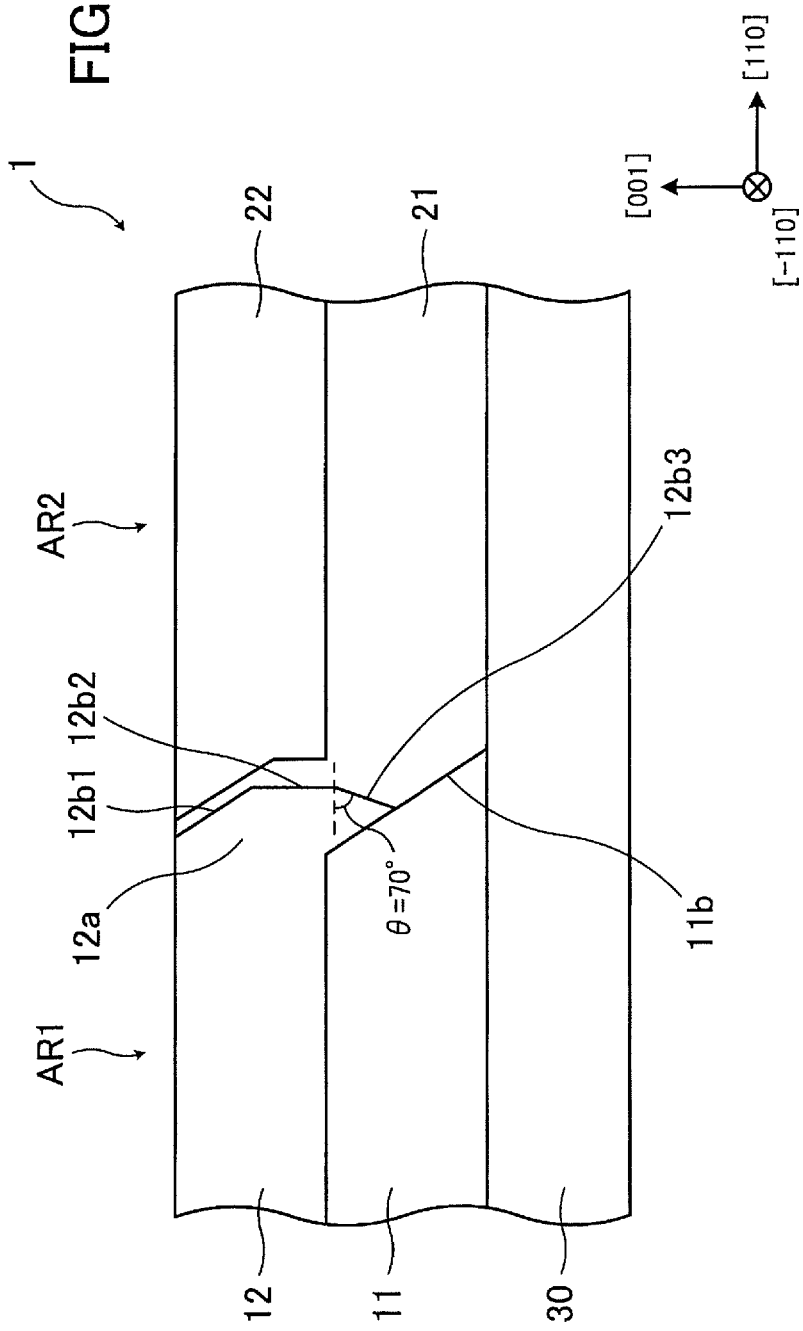

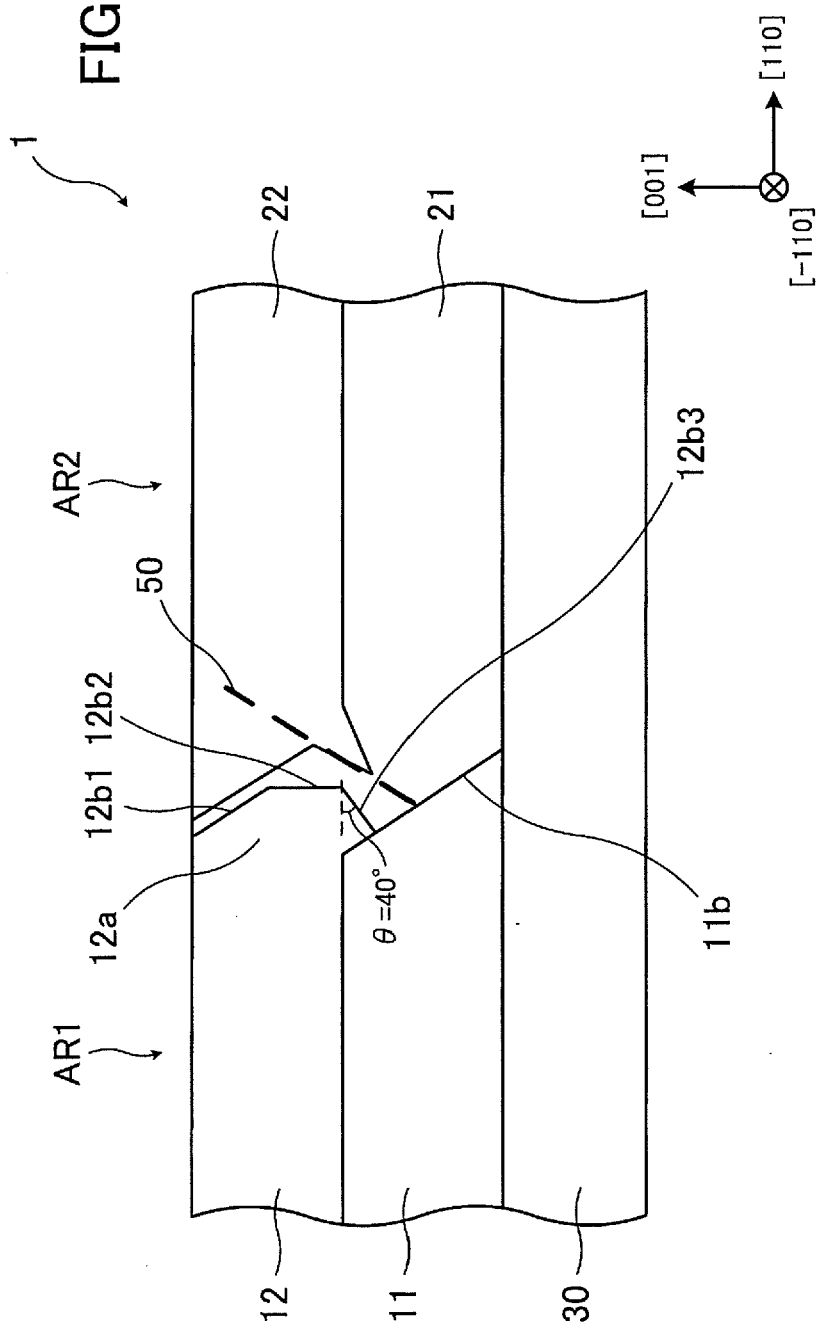

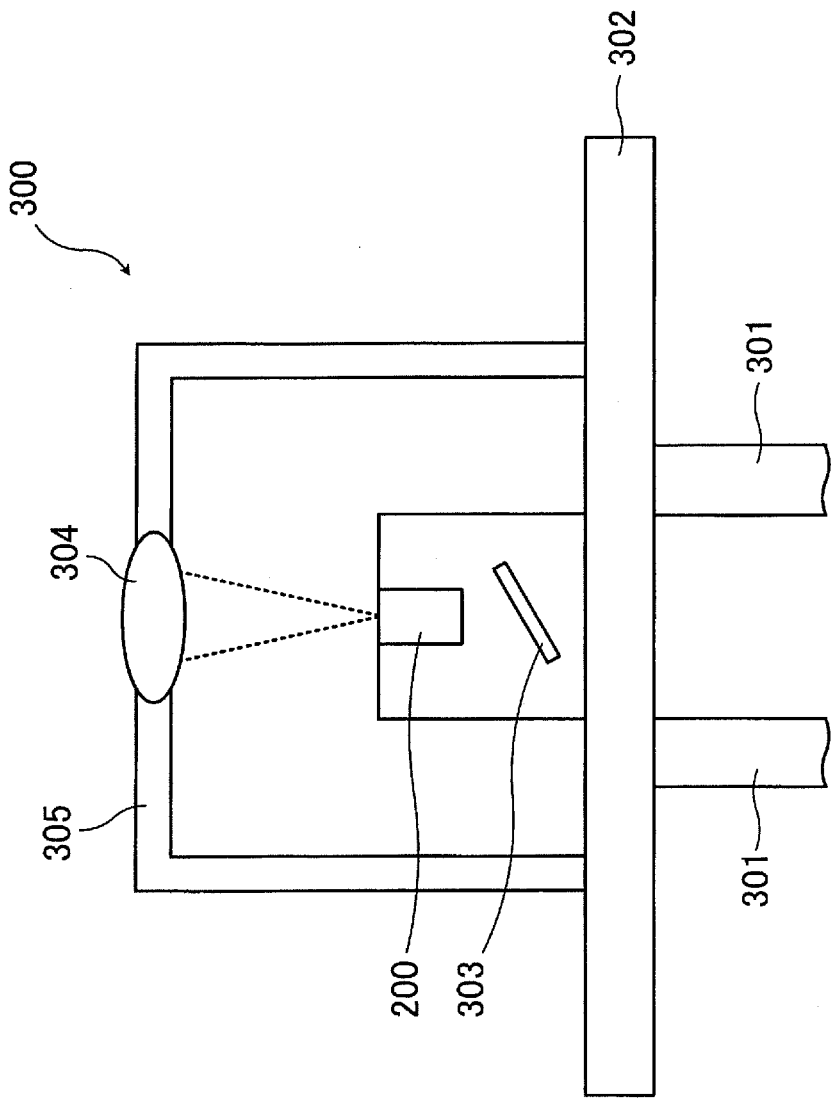

US 8,987,117 B2

SEMICONDUCTOR OPTICAL INTEGRATED DEVICE AND METHOD FOR FABRICATING THE SAME

CROSS-REFERENCE TO RELATED APPLICATION

This application is a Divisional application of prior application Ser. No. 13/611,099 filed on Sep. 12, 2012, which is a continuation application of International Application PCT/JP2011/050326 filed on Jan. 12, 2011 and designated the U.S., which is based upon and claims the benefit of priority of the prior Japanese Patent Application No. 2010-074204, filed on Mar. 29, 2010, the entire contents of which are incorporated herein by reference.

FIELD

The embodiments discussed herein are related to a semiconductor optical integrated device and a method for fabricating such a semiconductor optical integrated device.

BACKGROUND

A semiconductor optical integrated device in which a plurality of semiconductor optical devices are integrated onto a single substrate is effective in optical fiber communication from the viewpoint of miniaturization of an optical module.

A butt joint (BJ) growth method has traditionally been known as one of techniques for integrating a plurality of semiconductor optical devices onto a single substrate in this way. With the BJ growth method one semiconductor optical device structure is made to grow on a substrate. After that, a portion of the semiconductor optical device structure is removed and another semiconductor optical device structure is made to selectively regrow in the portion.

Japanese Laid-open Patent Publication No. 2002-314192
Japanese Laid-open Patent Publication No. 2008-053501
Japanese Laid-open Patent Publication No. 2002-217446
Japanese Laid-open Patent Publication No. 2001-189523
Japanese Laid-open Patent Publication No. 2007-201072
Japanese Laid-open Patent Publication No. 2004-273993
Japanese Laid-open Patent Publication No. 2002-324936
Japanese Laid-open Patent Publication No. 2002-243946
Japanese Laid-open Patent Publication No. 2003-174224

The advantage of the above BJ growth method is that semiconductor optical devices can be designed independently of one another. With a semiconductor optical integrated device fabricated by the use of the BJ growth method, however, a crystal defect or abnormal growth which appears in a junction (BJ portion) between semiconductor optical devices may cause, for example, deterioration in the reliability or initial characteristics of the semiconductor optical integrated device.

SUMMARY

According to an aspect, there is provided a semiconductor optical integrated device including a first semiconductor optical device formed over a (001) plane of a substrate and a second semiconductor optical device which is formed over the (001) plane of the substrate in a (110) orientation from the first semiconductor optical device and which is optically connected to the first semiconductor optical device, the first semiconductor optical device including a first core layer and a first clad layer which is formed over the first core layer and which has a first crystal surface on a side thereof on the second semiconductor optical device side that forms an angle greater than or equal to 55 degrees and less than or equal to 90 degrees with the (001) plane.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 1 is an example of the structure of a semiconductor optical integrated device;

FIGS. 2A, 2B, and 2C are an example of a method for fabricating the semiconductor optical integrated device, FIG. 2A being a fragmentary schematic sectional view of an example of a semiconductor growth step, FIG. 2B being a fragmentary schematic sectional view of an example of a side etching step, and FIG. 2C being a fragmentary schematic sectional view of an example of a heat treatment step;

FIG. 3 is a fragmentary schematic sectional view of a semiconductor regrowth step (part 1);

FIG. 4 is a fragmentary schematic sectional view of a semiconductor regrowth step (part 2);

FIG. 5 is a fragmentary schematic sectional view of a semiconductor regrowth step (part 3);

FIG. 25 is an example of the structure of an optical semiconductor module.

DESCRIPTION OF EMBODIMENTS

Figure 6:
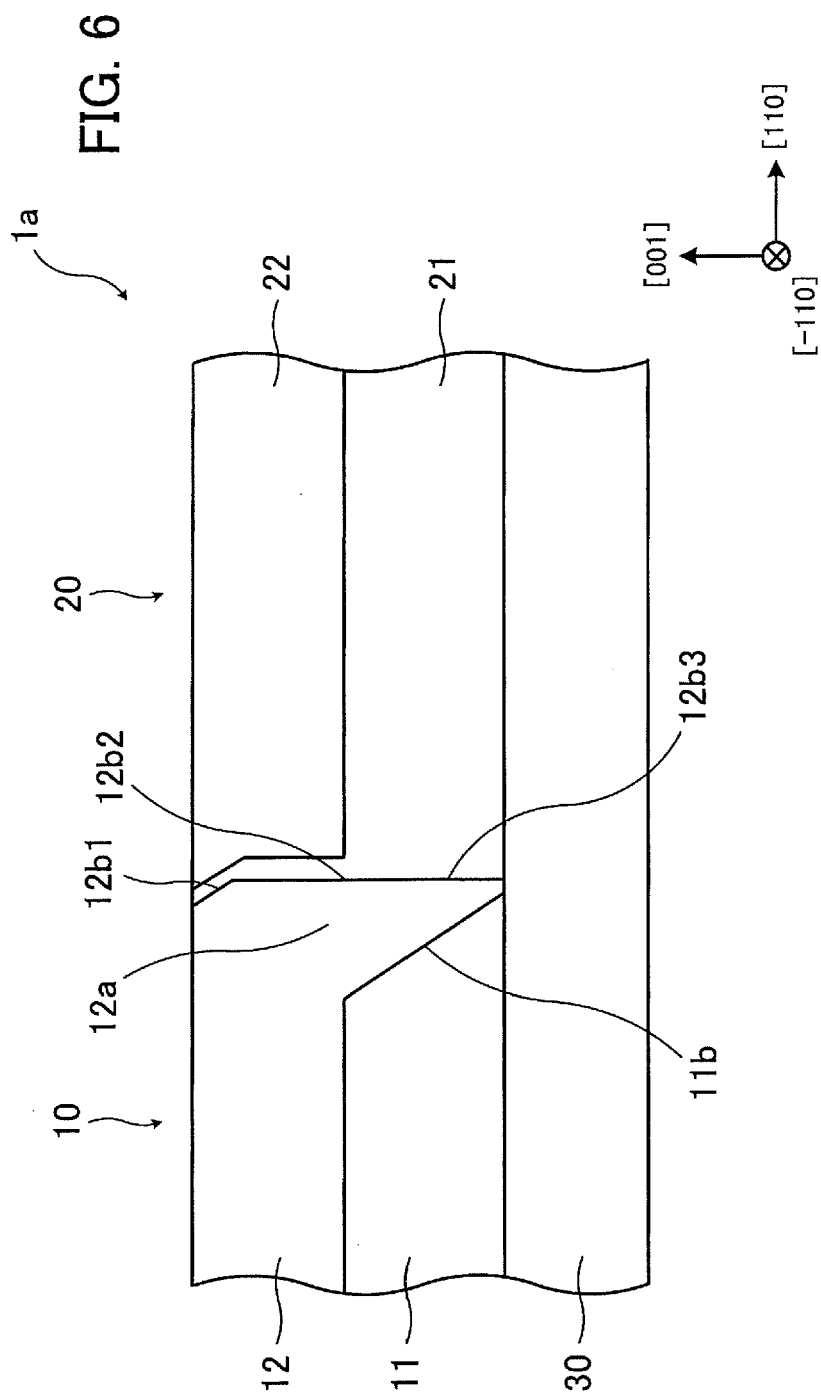
FIG. 6 is another example of the structure of a semiconductor optical integrated device.

FIG. 1 is an example of the structure of a semiconductor optical integrated device. FIG. 1 is a fragmentary schematic sectional view of an example of a semiconductor optical integrated device.

A semiconductor optical integrated device 1 illustrated in FIG. 1 includes a first semiconductor optical device 10 and a second semiconductor optical device 20 formed over a substrate 30 having a (001) plane.

The first semiconductor optical device 10 includes a first core layer 11 including an optical waveguide which is formed over the (001) plane of the substrate 30 and a first clad layer 12 formed over the first core layer 11. The second semiconductor optical device 20 includes a second core layer 21 including an optical waveguide which is formed over the (001) plane of the substrate 30 and a second clad layer 22 formed over the second core layer 21.

The first semiconductor optical device 10 and the second semiconductor optical device 20 are formed by the use of semiconducting materials and are arranged in a (110) orientation over the substrate 30. The first semiconductor optical device 10 and the second semiconductor optical device 20 can be formed by the use of the BJ growth method. That is to say, after the first core layer 11 and the first clad layer 12 of the first semiconductor optical device 10 are made to grow over the substrate 30, the second core layer 21 and the second clad layer 22 of the second semiconductor optical device 20 are made to regrow.

With the above semiconductor optical integrated device 1 the first core layer 11 of the first semiconductor optical device 10 is formed so that an end 11b of the first core layer 11 opposite to the second semiconductor optical device 20 will be slant. The first core layer 11 has on the second semiconductor optical device 20 side the end 11b having an A plane orientation. The end 11b is, for example, a (111) A plane.

In the example of FIG. 1, the first clad layer 12 is formed over the first core layer 11 so that an end portion 12a of the first clad layer 12 will cover a part of the end 11b of the first core layer 11. For convenience of explanation a surface of the end portion 12a of the first clad layer 12 will be divided into three parts, that is to say, an upper end 12b1, a middle end 12b2, and a lower end 12b3.

The upper end 12b1 of the first clad layer 12 has an A plane orientation and is, for example, a (111) A plane. The middle end 12b2 connected with the upper end 12b1 is a (110) plane which forms an angle of 90° with the (001) plane. The lower end 12b3 connected with the middle end 12b2 is a crystal surface. An angle θ which the crystal surface forms with the (001) plane is greater than or equal to 55 degrees and less than or equal to 90 degrees (55°≤θ≤90°). If θ=90°, then the lower end 12b3 is indicated by a solid line in FIG. 1. In this case, the lower end 12b3 is a (110) plane. This is the same with the middle end 12b2. If θ=55°, then the lower end 12b3 is a (111) B plane. If 55°≤θ≤90°, then the lower end 12b3 is a crystal surface having a B plane orientation.

The second semiconductor optical device 20 is formed in the (110) orientation from the first semiconductor optical device 10 having the above structure. In the example of FIG. 1, the second core layer 21 of the second semiconductor optical device 20 is formed so that it will cover sides of the first core layer 11 and the first clad layer 12 of the first semiconductor optical device 10. A part of the second core layer 21 is between the first clad layer 12 and the second clad layer 22.

An n-type indium phosphide (InP) substrate or the like can be used as the substrate 30 included in the above semiconductor optical integrated device 1. Aluminum gallium indium arsenide (AlGaInAs) or the like can be used for forming the first core layer 11 of the first semiconductor optical device 10. p-type InP can be used for forming the first clad layer 12 of the first semiconductor optical device 10. AlGaInAs or gallium indium arsenide phosphide (GaInAsP) can be used for forming the second core layer 21 of the second semiconductor optical device 20. p-type InP can be used for forming the second clad layer 22 of the second semiconductor optical device 20.

The semiconductor optical integrated device 1 illustrated in FIG. 1 can be fabricated by, for example, the following method.

FIGS. 2A, 2B, and 2C are an example of a method for fabricating the semiconductor optical integrated device. FIG. 2A is a fragmentary schematic sectional view of an example of a semiconductor growth step. FIG. 2B is a fragmentary schematic sectional view of an example of a side etching step. FIG. 2C is a fragmentary schematic sectional view of an example of a heat treatment step.

As illustrated in FIG. 2A, first the first core layer 11 and the first clad layer 12 of the first semiconductor optical device 10 are made to grow both in a first semiconductor optical device region AR1 over the substrate 30 and in a second semiconductor optical device region AR2 over the substrate 30. The first core layer 11 and the first clad layer 12 can be made to grow by, for example, a metal organic vapor phase epitaxy (MOVPE) method.

As illustrated in FIG. 2A, a dielectric mask 40 which covers the first semiconductor optical device region AR1 is then formed. A region in the (110) orientation from the first semiconductor optical device region AR1 is exposed as the second semiconductor optical device region AR2 from the dielectric mask 40.

As illustrated in FIG. 2B, etching is then performed with the dielectric mask 40 as a mask to remove the first core layer 11 and the first clad layer 12 which are made to grow in the second semiconductor optical device region AR2.

For example, wet etching is performed. Alternatively, after dry etching is performed, wet etching is performed. By doing so, the first core layer 11 and the first clad layer 12 can be removed. Side etching of the first core layer 11 and the first clad layer 12 progresses by wet etching. When wet etching is performed, the first clad layer 12, for example, is selectively etched (side-etched) first and then the first core layer 11 is selectively etched (side-etched). An amount S1 by which the first core layer 11 is side-etched can be controlled by the quality of a material for the first core layer 11 or an etching condition such as the type of an etchant or etching time. An amount S2 by which the first clad layer 12 is side-etched can be controlled by the quality of a material for the first clad layer 12 or an etching condition such as the type of an etchant or etching time.

By performing the above side etching, as illustrated in FIG. 2B, ends 12b and 11b each having an A plane orientation appear in an end portion 12a of the first clad layer 12 and an end portion 11a of the first core layer 11 respectively. For example, a (111) A plane appears on the end 12b of the first clad layer 12 and (111) A plane also appears on the end 11b of the first core layer 11.

Heat treatment is performed after the side etching. Heat treatment can be performed by heating, for example, in a temperature rise step and a temperature maintenance step before the beginning of the growth of the second core layer 21 in the second semiconductor optical device region AR2. Alternatively, heat treatment is performed before the growth of the second core layer 21 and the growth of the second core layer 21 (temperature rise step through the growth of the second core layer 21) may be performed after the heat treatment.

If III-V compound semiconductors are made to grow as the first core layer 11 and the first clad layer 12, then it is desirable to perform heat treatment in an atmosphere which contains a group V element. The reason for this is as follows. The vapor pressure of a group V element is high compared with a group III element. Accordingly, the disappearance of a group V element from a III-V compound semiconductor is controlled. For example, if AlGaInAs and InP are used for forming the first core layer 11 and the first clad layer 12 respectively, then heat treatment is performed in an atmosphere of phosphine ($PH_3$).

As illustrated in FIG. 2C, the heat treatment after the side etching causes mass transport in the end portion 12a of the first clad layer 12.

The end 12b in the end portion 12a of the first clad layer 12 is slant as a result of the side etching before the heat treatment so that an A plane will appear. Furthermore, the first core layer 11 is also side-etched, so there is a space under the end portion 12a. That is to say, the end portion 12a of the first clad layer 12 is protruding like a penthouse from the first core layer. 11 before the heat treatment.

When heating is performed, the end portion 12a having the above shape tends to go into a thermally unstable state. Accordingly, in order to create a more stable state, mass transport to the end 11b side of the first core layer 11 occurs in the end portion 12a. As illustrated in FIG. 2C, an edge at the tip of the end portion 12a disappears as a result of the occurrence of the mass transport. In addition to the end 12b (upper end 12b1), the middle end 12b2 which is a (110) plane and the lower end 12b3 which forms an angle θ with the (001) plane are formed.

The amount of the mass transport can be controlled by conditions, such as temperature and time, under which the heat treatment is performed. As the conditions under which the heat treatment is performed are changed so as to increase the amount of the mass transport, the shape of the end portion 12a gradually changes as indicated by an arrow in FIG. 2C. A (110) plane appears on the middle end 12b2 and an angle θ which the lower end 12b3 forms with the (001) plane increases. When an angle θ which the lower end 12b3 forms with the (001) plane becomes 90 degrees, the lower end 12b3 becomes a (110) plane like the middle end 12b2 and further progress of the mass transport is controlled.

The amount of the above mass transport which occurs in the heat treatment after the side etching is controlled so as to control an angle θ which the lower end 12b3 forms with the (001) plane in the range of $55° \leq \theta \leq 90°$. By controlling an angle θ which the lower end 12b3 forms with the (001) plane in this way, the occurrence of a trouble, such as a crystal defect, in a junction (BJ portion) between the first semiconductor optical device 10 and the second semiconductor optical device 20 can effectively be controlled at the time of the following formation (regrowth) of the second semiconductor optical device 20.

The formation (regrowth) of the second semiconductor optical device 20 will now be described with reference to FIGS. 3 through 5. FIG. 3 is a fragmentary schematic sectional view of a semiconductor regrowth step in which θ is set to 90 degrees. FIG. 4 is a fragmentary schematic sectional view of a semiconductor regrowth step in which θ is set to 70 degrees. FIG. 5 is a fragmentary schematic sectional view of a semiconductor regrowth step in which θ is set to 40 degrees.

A state illustrated in each of FIGS. 3 through 5 is obtained after the above heat treatment. After that, the second core layer 21 and the second clad layer 22 are made to grow in the second semiconductor optical device region AR2. For example, the MOVPE method can be used for making the second core layer 21 and the second clad layer 22 grow.

First, when an angle θ which the lower end 12b3 forms with the (001) plane and which is obtained by the mass transport is 40 degrees as illustrated in FIG. 5, the growth of the second core layer 21 and the second clad layer 22 is as follows.

In the second semiconductor optical device region AR2 the second core layer 21 grows upward from the substrate 30 and on a side of the first semiconductor optical device 10. That is to say, the second core layer 21 also grows on the end 11b of the first core layer 11 and the upper end 12b1, the middle end 12b2, and the lower end 12b3 of the first clad layer 12. If at this time there is a B plane, like the lower end 12b3 illustrated in FIG. 5, which forms a relatively little angle θ (angle of 40 degrees, for example) with the (001) plane, then a stacking fault 50 may occur in the BJ portion between the first semiconductor optical device 10 and the second semiconductor optical device 20. The likely reason for the occurrence of the stacking fault 50 is that the impact of a growth surface of the second core layer 21 which grows along the lower end 12b3 that is a B plane and a growth surface of the second core layer 21 which grows along the end 11b of the first core layer 11 that is an A plane takes place.

If the second clad layer 22 is made to grow after the growth of the second core layer 21 in a state in which the above stacking fault 50 has occurred, then the stacking fault 50 may also occur in the second clad layer 22.

The stacking fault 50 which occurs in the BJ portion between the first semiconductor optical device 10 and the second semiconductor optical device 20 may cause a deterioration in the reliability of the fabricated semiconductor optical integrated device 1.

Furthermore, when the second core layer 21 and the second clad layer 22 are made to grow in a state indicated in FIG. 5, abnormal growth may take place in the BJ portion between the first semiconductor optical device 10 and the second semiconductor optical device 20. This abnormal growth may cause an increase in the thickness of a film in the BJ portion between the first semiconductor optical device 10 and the second semiconductor optical device 20. This may lead to a change in refractive index in the BJ portion and a deterioration of the initial characteristics such as optical output.

In the case of FIG. 3 in which a B plane is not formed or in the case of FIG. 4 in which a B plane that forms a relatively great angle θ with the (001) plane is formed, on the other hand, a stacking fault 50 or abnormal growth like that described above hardly takes place.

As illustrated in FIG. 3, if the mass transport progresses very far and both of the middle end 12b2 and the lower end 12b3 of the first clad layer 12 are (110) planes, the impact of growth surfaces of the second core layer 21 is controlled at the time of the growth of the second core layer 21. That is to say, the impact of a growth surface of the second core layer 21 which grows along the middle end 12b2 and the lower end 12b3 that are (110) planes and a growth surface of the second core layer 21 which grows along the end 11b of the first core layer 11 that is an A plane is controlled and the occurrence of a stacking fault 50 like that described above is controlled. Therefore, it is possible to make the second clad layer 22 grow after the growth of the second core layer 21, while controlling the occurrence of a stacking fault 50. In addition, when the second core layer 21 and the second clad layer 22 are made to grow in a state indicated in FIG. 3, the occurrence of abnormal growth is also controlled.

Furthermore, as illustrated in FIG. 4 in which the lower end 12b3 that is a B plane and that forms a relatively great angle θ (angle of 70 degrees, for example) with the (001) plane is formed, the occurrence of a stacking fault 50 like that described above is controlled. The impact of a growth surface of the second core layer 21 which grows along the lower end 12b3 that is a B plane and a growth surface of the second core layer 21 which grows along the end 11b of the first core layer 11 that is an A plane takes place, but it may safely be said that a stacking fault 50 hardly occurs. Accordingly, it is possible to make the second clad layer 22 grow after the growth of the second core layer 21, while controlling the occurrence of a stacking fault 50. In addition, when the second core layer 21 and the second clad layer 22 are made to grow in a state indicated in FIG. 4, the occurrence of abnormal growth is also controlled.

The occurrence of a trouble, such as a stacking fault, in the BJ portion between the first semiconductor optical device 10 and the second semiconductor optical device 20 depends on an angle θ which the lower end 12b3 forms with the (001) plane. Detailed experiments show that when an angle θ which the lower end 12b3 forms with the (001) plane meets 55°≤θ≤90°, the occurrence of a trouble in the BJ portion between the first semiconductor optical device 10 and the second semiconductor optical device 20 can be controlled. The first semiconductor optical device 10 is made to grow by the BJ growth method before the growth of the second semiconductor optical device 20. The lower end 12b3 of the first clad layer 12 on the first semiconductor optical device 10 side is formed so that it will form a determined angle θ with the (001) plane. The second semiconductor optical device 20 is then made to regrow. By doing so, the high performance semiconductor optical integrated device 1 with high reliability can be realized.

In the above description the case where the end portion 12a of the first clad layer 12 on the first semiconductor optical device 10 side covers a part of the end 11b of the first core layer 11 is taken as an example. However, the end portion 12a of the first clad layer 12 may cover the entire end 11b of the first core layer 11.

FIG. 6 is another example of the structure of a semiconductor optical integrated device. FIG. 6 is a fragmentary schematic sectional view of an example of a semiconductor optical integrated device.

With a semiconductor optical integrated device 1a illustrated in FIG. 6, an entire end 11b of a first core layer 11 on a first semiconductor optical device 10 side is covered with an end portion 12a of a first clad layer 12. In the other respects the structure of the semiconductor optical integrated device 1a is the same as that of the above semiconductor optical integrated device 1.

The end portion 12a of the first clad layer 12 has an upper end 12b1 which is an A plane and a middle end 12b2 and a lower end 12b3 which are (110) planes (that is to say, the above angle θ is 90 degrees).

For example, in order to form this end portion 12a, side etching is performed in the following way at the time of forming the first semiconductor optical device 10. An amount S1 by which the first core layer 11 is side-etched is made large, compared with an amount S2 by which the first clad layer 12 is side-etched and compared with the case of the above FIG. 2B. By doing so, a larger amount of mass transport progresses in the end portion 12a at the time of heat treatment performed later. Accordingly, a structure in which the entire end 11b of the first core layer 11 is covered with the end portion 12a after the mass transport can be obtained.

By adopting this structure, the impact of growth surfaces or abnormal growth is controlled at the time of the regrowth of a second core layer 21 and a second clad layer 22 of a second semiconductor optical device 20 performed after the formation of the first semiconductor optical device 10. As a result, the high performance semiconductor optical integrated device 1a with high reliability can be realized.

In the above description the first clad layer 12 is side-etched in the step of FIG. 2B. However, it is not necessary to side-etch the first clad layer 12. Even if the first clad layer 12 is not side-etched, mass transport occurs in the first clad layer 12 by side-etching the first core layer 11 and then performing heat treatment. If as a result of this mass transport, the middle end 12b2 of the first clad layer 12 becomes a (110) plane and an angle θ which the lower end 12b3 forms with the (001) plane meets 55°≤θ≤90°, then the occurrence of a trouble, such as a stacking fault, can also be controlled at the time of regrowth on the second semiconductor optical device 20 side.

When the above semiconductor optical integrated device 1 or 1a is fabricated, the BJ portion in which the occurrence of a trouble, such as a stacking fault, is controlled can be formed, for example, by selectively wet-etching the first clad layer 12 and the first core layer 11. In this case, the shape after the etching of the sides or bottoms of the first clad layer 12 and the first core layer 11 can be reproduced with accuracy.

In addition, heat treatment which causes mass transport in the first clad layer 12 can be performed, for example, in a reactor of a MOVPE system in which the second core layer 21 is made to grow. After the heat treatment is performed, the second core layer 21 can be made to grow. In this case, it is possible to obtain a BJ portion in which the occurrence of a trouble, such as a stacking fault, is controlled without increasing the number of steps.

A semiconductor optical integrated device will now be described more concretely.

A first embodiment will be described first.

Description will be given with a modulator-integrated laser (semiconductor optical integrated device) in which a laser (semiconductor optical device) and a modulator (semiconductor optical device) are integrated as an example. Such a modulator-integrated laser will now be described in order of fabrication step.

Figure 7:
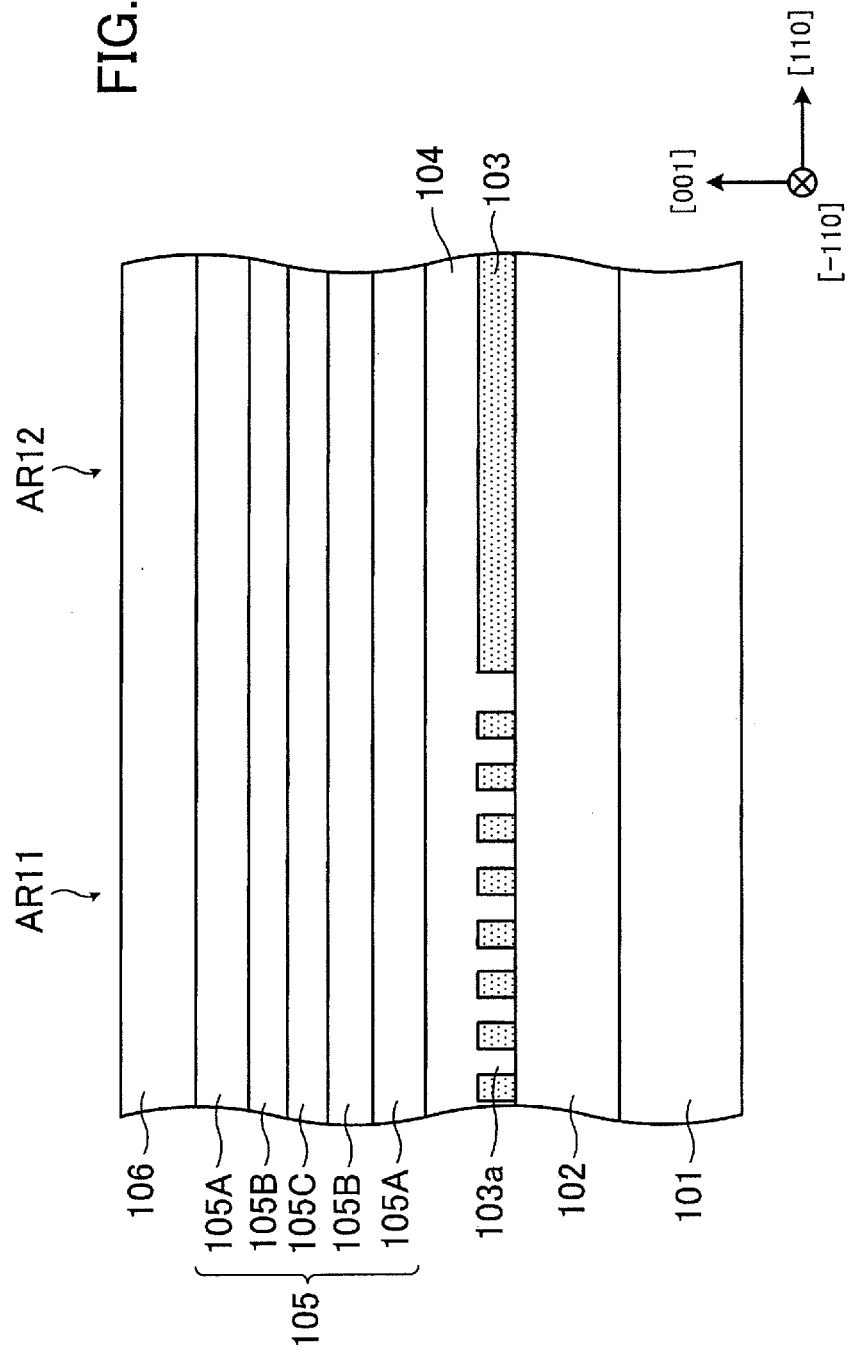
FIG. 7 is a fragmentary schematic sectional view of a first semiconductor growth step in a first embodiment.

FIG. 7 is a fragmentary schematic sectional view of a first semiconductor growth step in a first embodiment.

First a semiconductor layer in which a laser is to be formed is formed over an n-InP (001) substrate 101. The semiconductor layer can be made to grow by the use of the MOVPE method.

First an n-InP buffer layer 102 with a carrier concentration of $5 \times 10^{17}$ cm$^{-3}$ is made to grow over the n-InP (001) substrate 101. An n-InGaAsP layer 103 with a carrier concentration of $5 \times 10^{17}$ cm$^{-3}$, a composition wavelength of 1.1 μm, and a thickness of 100 nm is then made to grow over the n-InP buffer layer 102. After that, an n-InP cap layer with a carrier concentration of $5 \times 10^{17}$ cm$^{-3}$ and a thickness of 10 nm is made to grow over the n-InGaAsP layer 103. Resist coating, electron beam exposure, development, and etching are then performed in order to form a diffraction grating 103a at pitches of 200 nm in the n-InGaAsP layer 103 in a laser region AR11. An n-InP spacer layer 104 with a thickness of 100 nm for burying the diffraction grating 103a is then made to grow in a temperature range in which the formed diffraction grating 103a is not thermally deformed.

An AlGaInAs separate confinement heterostructure (SCH) 105A with a composition wavelength of 1.1 μm and a thickness of 50 nm is then made to grow. In order to form an AlGaInAs multiquantum well layer, an AlGaInAs barrier layer 105B with a composition wavelength of 1.1 μm and a thickness of 10 nm and an AlGaInAs well layer 105C with a composition wavelength of 1.45 μm and a thickness of 5 nm are then repeatedly (total of ten cycles, for example) made to grow. In addition, an AlGaInAs separate confinement heterostructure 105A with a composition wavelength of 1.1 μm and a thickness of 50 nm is made to grow. By doing so, an AlGaInAs core layer 105 is formed.

A p-InP clad layer 106 with a carrier concentration of $5 \times 10^{17}$ cm$^{-3}$ and a thickness of 150 nm is then made to grow over the AlGaInAs core layer 105.

Figure 8:
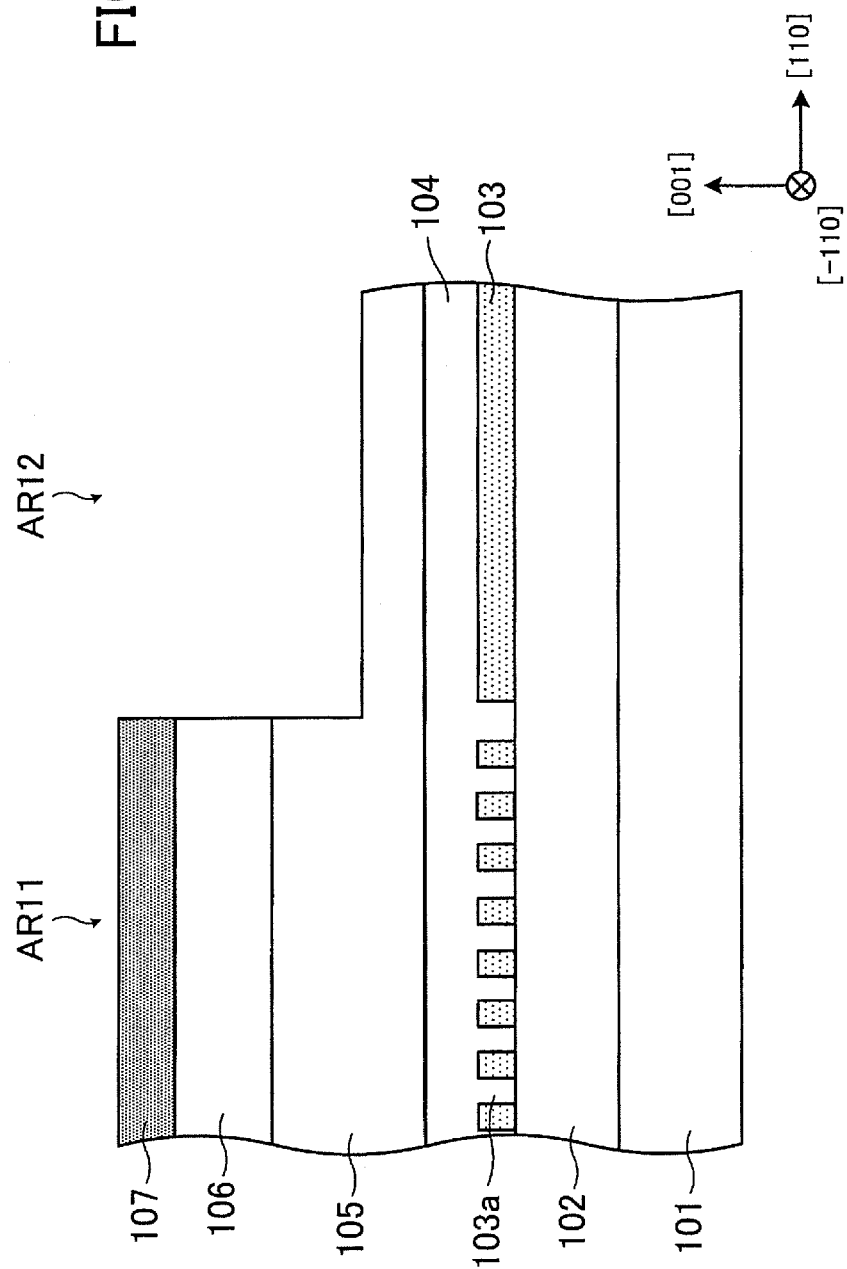
FIG. 8 is a fragmentary schematic sectional view of a first etching step in the first embodiment.

FIG. 8 is a fragmentary schematic sectional view of a first etching step in the first embodiment.

After each semiconductor layer is formed as illustrated in FIG. 7, dielectric masks 107 are formed in the laser region AR11. Each dielectric mask 107 extends in the (110) orientation and has the shape of a pattern which is 20 μm in width and 300 μm in length. The dielectric masks 107 are formed in the (110) orientation at intervals of 600 μm. The dielectric masks 107 are made of, for example, silicon dioxide ($SiO_2$).

Dry etching is then performed in a modulator region AR12 with the dielectric masks 107 as a mask. In this case, the p-InP clad layer 106 and the AlGaInAs core layer 105 in the modulator region AR12 are etched to a part of the AlGaInAs core layer 105 (to a depth of about 280 nm, for example).

Figure 9:
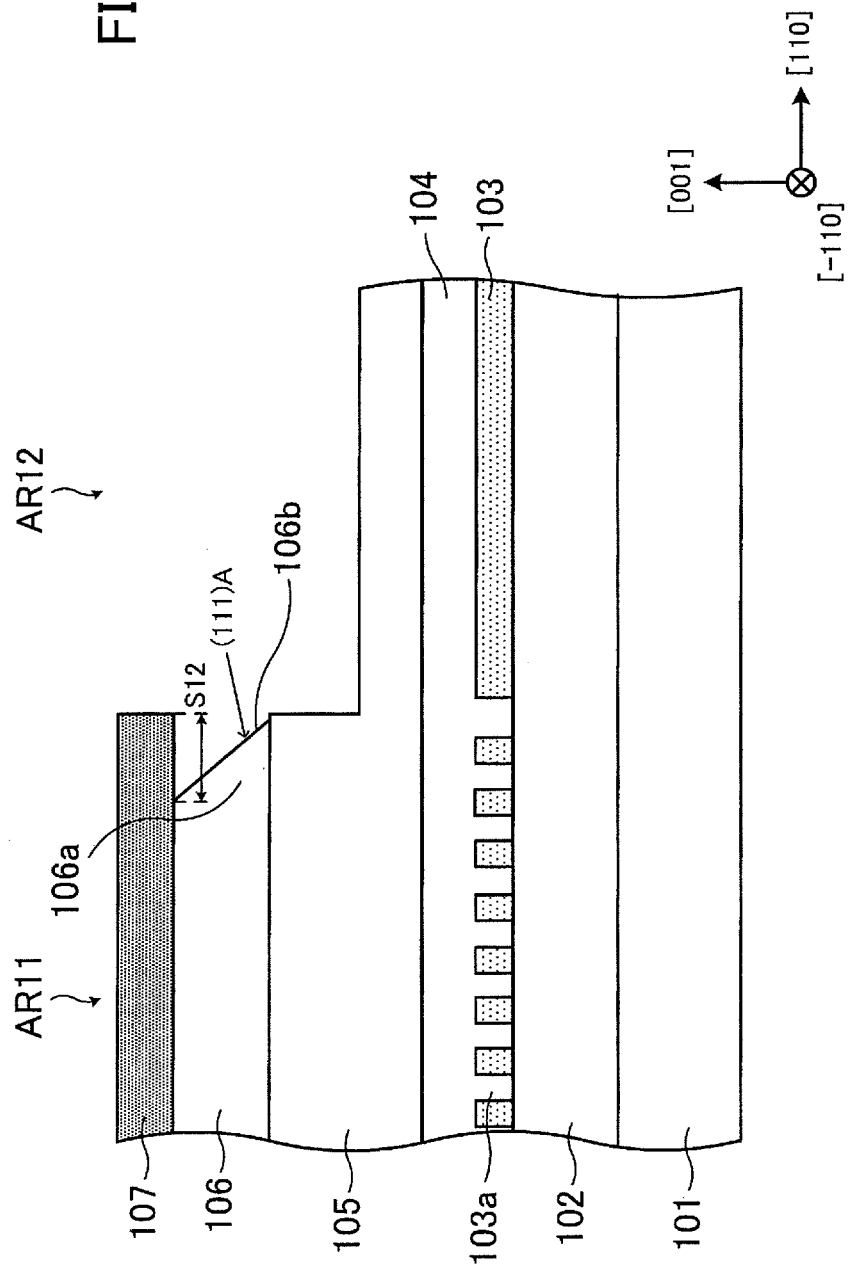
FIG. 9 is a fragmentary schematic sectional view of a second etching step in the first embodiment.

FIG. 9 is a fragmentary schematic sectional view of a second etching step in the first embodiment.

After the etching illustrated in FIG. 8 is performed, the p-InP clad layer 106 is wet-etched. The p-InP clad layer 106 is selectively etched by the use of a bromine (Br)-based etchant. The p-InP clad layer 106 is side-etched by this etching so that an amount S12 by which an end portion 106a of the p-InP clad layer 106 is side-etched will become about 100 nm. At this time a (111) A plane appears on an end 106b of the p-InP clad layer 106.

Furthermore, a penthouse of the dielectric mask 107 is formed over the p-InP clad layer 106 as a result of this side etching. This penthouse of the dielectric mask 107 prevents a semiconductor from growing onto the dielectric mask 107 at the time of the growth of a semiconductor layer in which a modulator described later is to be formed.

Figure 10:
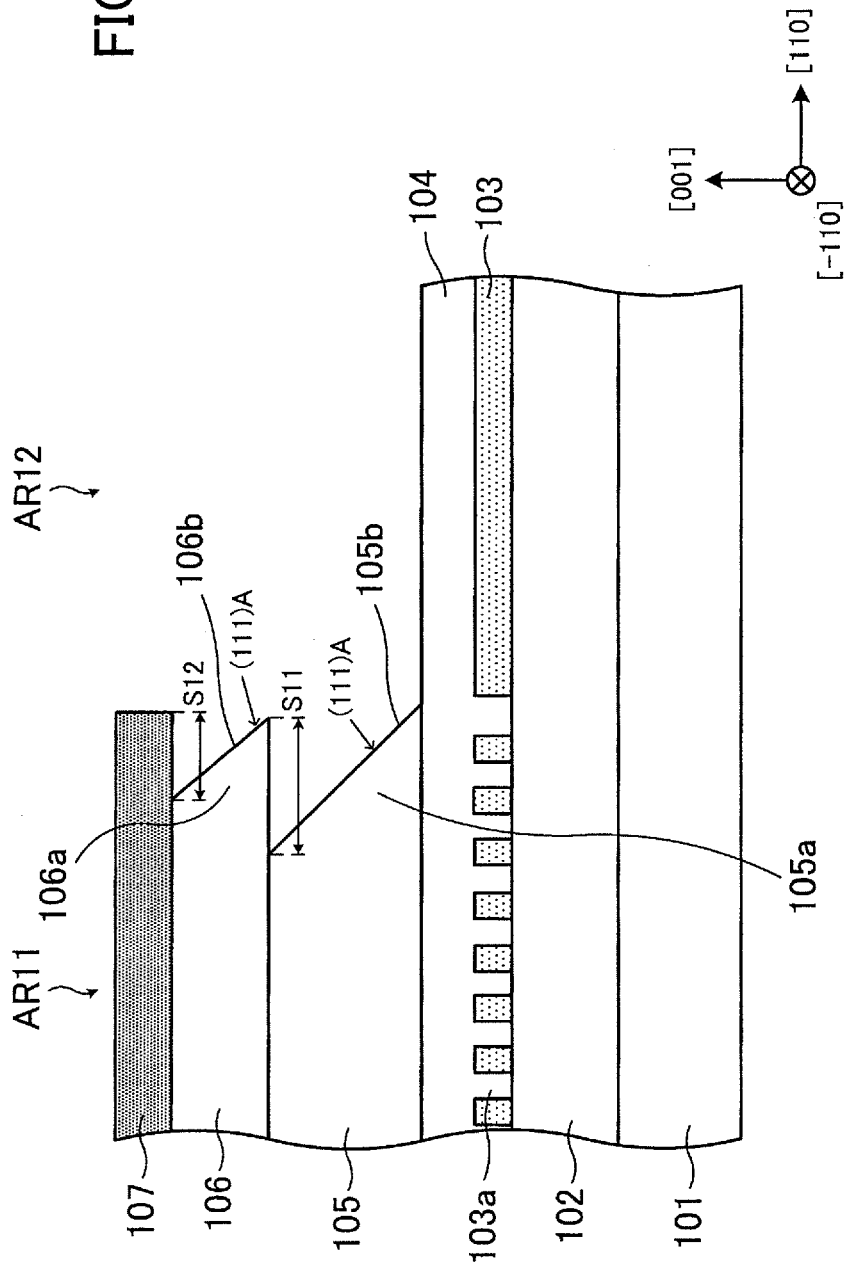
FIG. 10 is a fragmentary schematic sectional view of a third etching step in the first embodiment.

FIG. 10 is a fragmentary schematic sectional view of a third etching step in the first embodiment.

After the p-InP clad layer 106 is side-etched, the AlGaInAs core layer 105 is wet-etched. The AlGaInAs core layer 105 is selectively etched by the use of a solution of dilute sulfuric acid and hydrogen peroxide water as an etchant. The AlGaInAs core layer 105 is side-etched by this etching so that an amount S11 by which an end portion 105a of the AlGaInAs core layer 105 is side-etched will become about 120 nm. At this time a (111) A plane appears on an end 105b of the AlGaInAs core layer 105.

In addition, the n-InP spacer layer 104 under the AlGaInAs core layer 105 gets exposed in the modulator region AR12 by this etching. By properly setting conditions under which the AlGaInAs core layer 105 is wet-etched, it is possible to control etching of the n-InP spacer layer 104, selectively etch the AlGaInAs core layer 105, and set the side etching amount S11 to a determined value.

Figure 11:
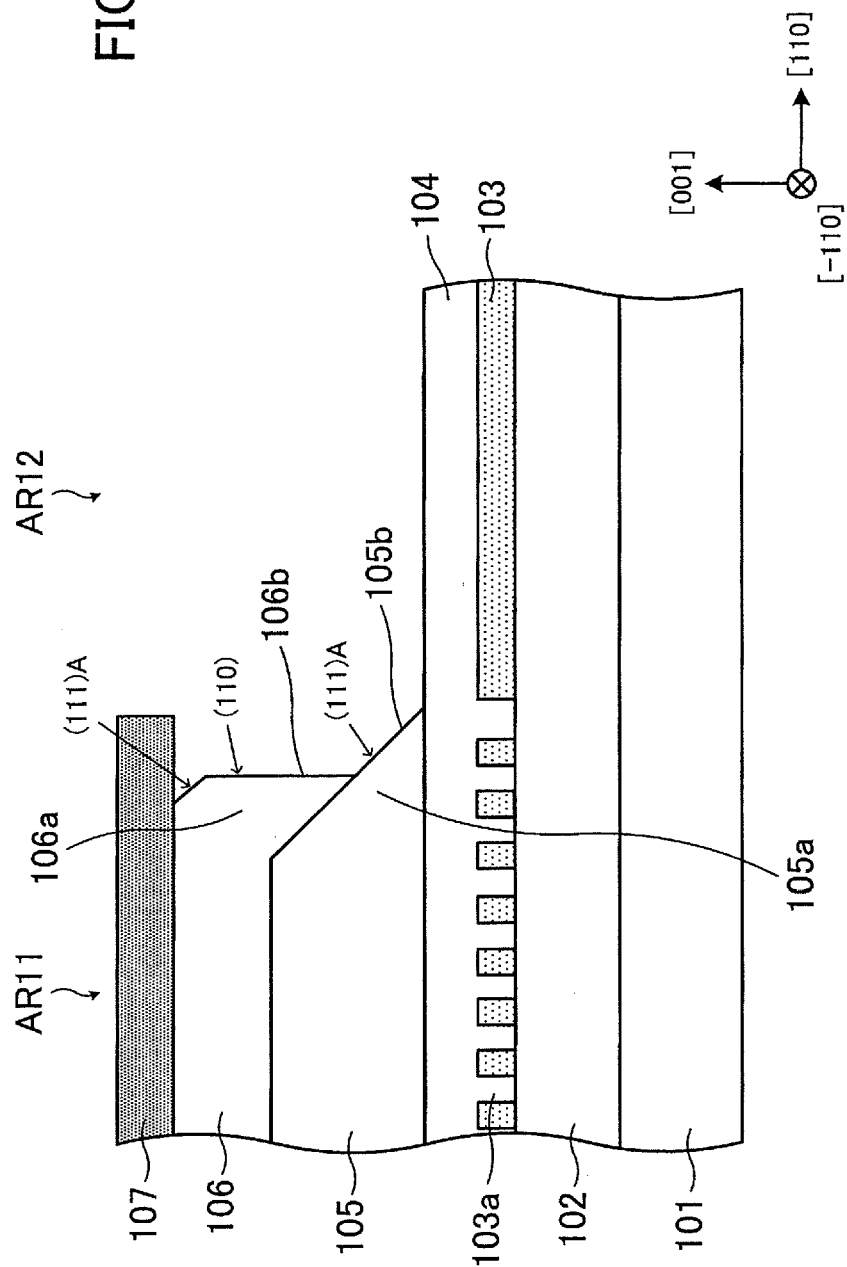
FIG. 11 is a fragmentary schematic sectional view of a heat treatment step in the first embodiment.

FIG. 11 is a fragmentary schematic sectional view of a heat treatment step in the first embodiment.

After the p-InP clad layer 106 and the AlGaInAs core layer 105 are wet-etched, heat treatment is performed to cause mass transport in the end portion 106a of the p-InP clad layer 106.

For example, the substrate after the wet etching is set in a reactor of a MOVPE system and its temperature is raised to 690° C. in an atmosphere of $PH_3$. At this time mass transport of InP occurs. For example, as illustrated in FIG. 11, the (111) A plane remains in an upper part of the end portion 106a of the p-InP clad layer 106 and a (110) plane which forms an angle of 90° with a (001) plane appears in a lower part of the end portion 106a of the p-InP clad layer 106. An upper part of the end 105b of the AlGaInAs core layer 105 is covered with the end portion 106a of the p-InP clad layer 106 after the mass transport and a lower part of the end 105b of the AlGaInAs core layer 105 is kept in a state in which the (111) A plane is exposed. A (110) plane is formed on a side of the p-InP clad layer 106 and is connected to the end 105b of the AlGaInAs core layer 105.

This shape of the side of the p-InP clad layer 106 can be obtained by properly setting the above side etching amounts S11 and S12 (FIGS. 9 and 10) and causing sufficient mass transport by the heat treatment (FIG. 11).

Figure 12:
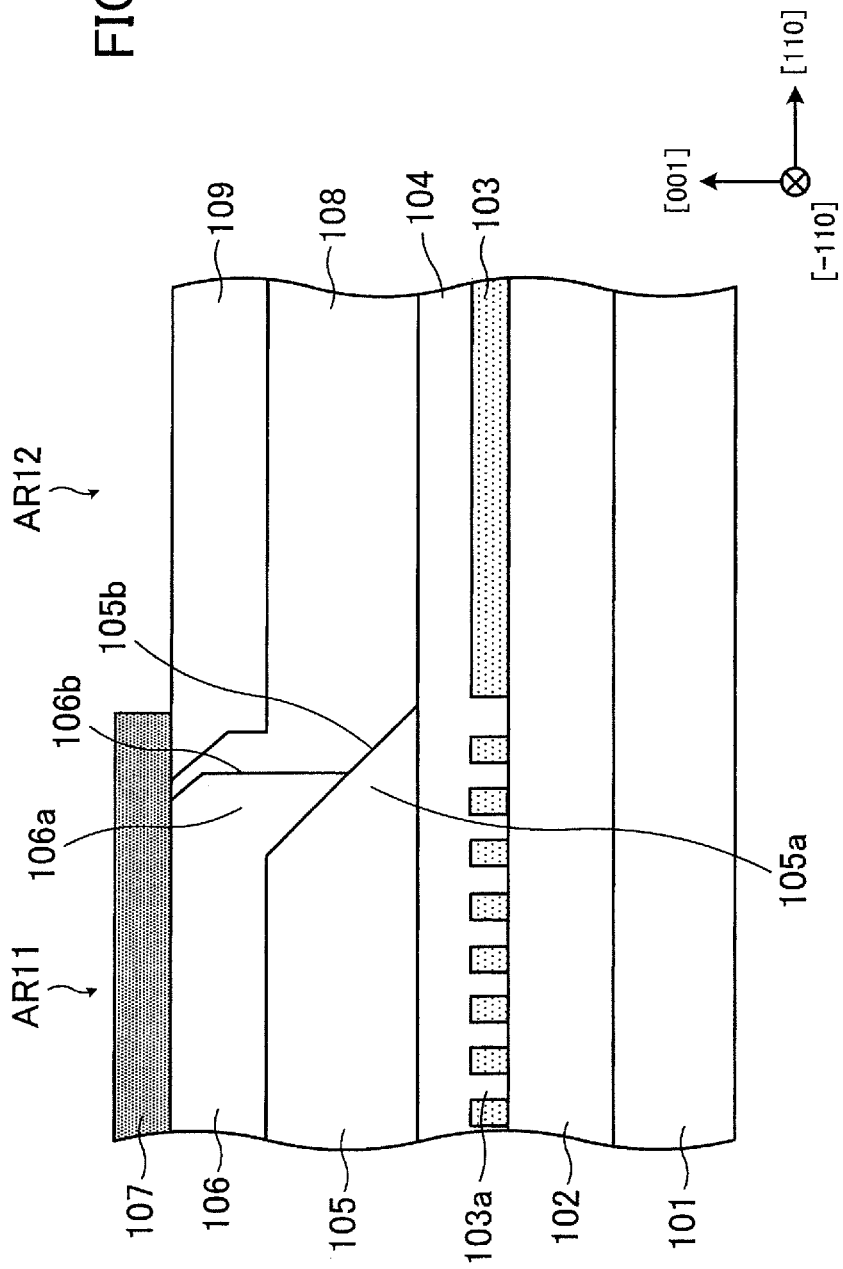
FIG. 12 is a fragmentary schematic sectional view of a second semiconductor growth step in the first embodiment.

FIG. 12 is a fragmentary schematic sectional view of a second semiconductor growth step in the first embodiment.

After the mass transport is caused in the end portion 106a of the p-InP clad layer 106 by the heat treatment, an AlGaInAs core layer 108 and a p-InP clad layer 109 are made to grow in the modulator region AR12. This is the same with the laser region AR11 side.

In order to form the AlGaInAs core layer 108, first an AlGaInAs separate confinement heterostructure with a composition wavelength of 1.2 μm and a thickness of 50 nm is made to grow. In order to form an AlGaInAs multiquantum well layer, an AlGaInAs barrier layer with a composition wavelength of 1.2 μm and a thickness of 5 nm and an AlGaInAs well layer with a composition wavelength of 1.35 μm and a thickness of 10 nm are then repeatedly (total of ten cycles, for example) made to grow. In addition, an AlGaInAs separate confinement heterostructure with a composition wavelength of 1.2 μm and a thickness of 50 nm is made to grow.

A p-InP layer with a carrier concentration of $5 \times 10^{17}$ cm$^{-3}$ and a thickness of 150 nm is made to grow as the p-InP clad layer 109.

When the AlGaInAs core layer 108 is made to grow, crystal surfaces which are exposed on the sides on the laser region AR11 side are the (111) A plane and the (110) plane. Accordingly, the impact of growth surfaces can be avoided and the occurrence of a stacking fault or the like can be controlled. As a result, the p-InP clad layer 109 in which the occurrence of a stacking fault or the like is controlled can be formed.

As stated above, a penthouse of the dielectric mask 107 is formed. By doing so, the AlGaInAs core layer 108 and p-InP clad layer 109 can be made to grow in a region below the dielectric mask 107.

The AlGaInAs core layer 108 and p-InP clad layer 109 can be made to grow by the use of the same MOVPE system after the heat treatment for causing mass transport in the end portion 106a of the p-InP clad layer 106. At this time the heat treatment can be used as a temperature rise step and a temperature maintenance step before the beginning of the growth of the AlGaInAs core layer 108 (before the introduction of materials). By doing so, an increase in the number of steps performed for realizing the shape of the end portion 106a of the p-InP clad layer 106 illustrated in FIG. 11 can be controlled.

By performing the above steps illustrated in FIGS. 7 through 12, a structure (BJ structure) in which a basic structure of a laser and a basic structure of a modulator are joined together in a state in which they are arranged in the (110) orientation and in which they are optically connected is obtained over the n-InP (001) substrate 101.

Figure 13:
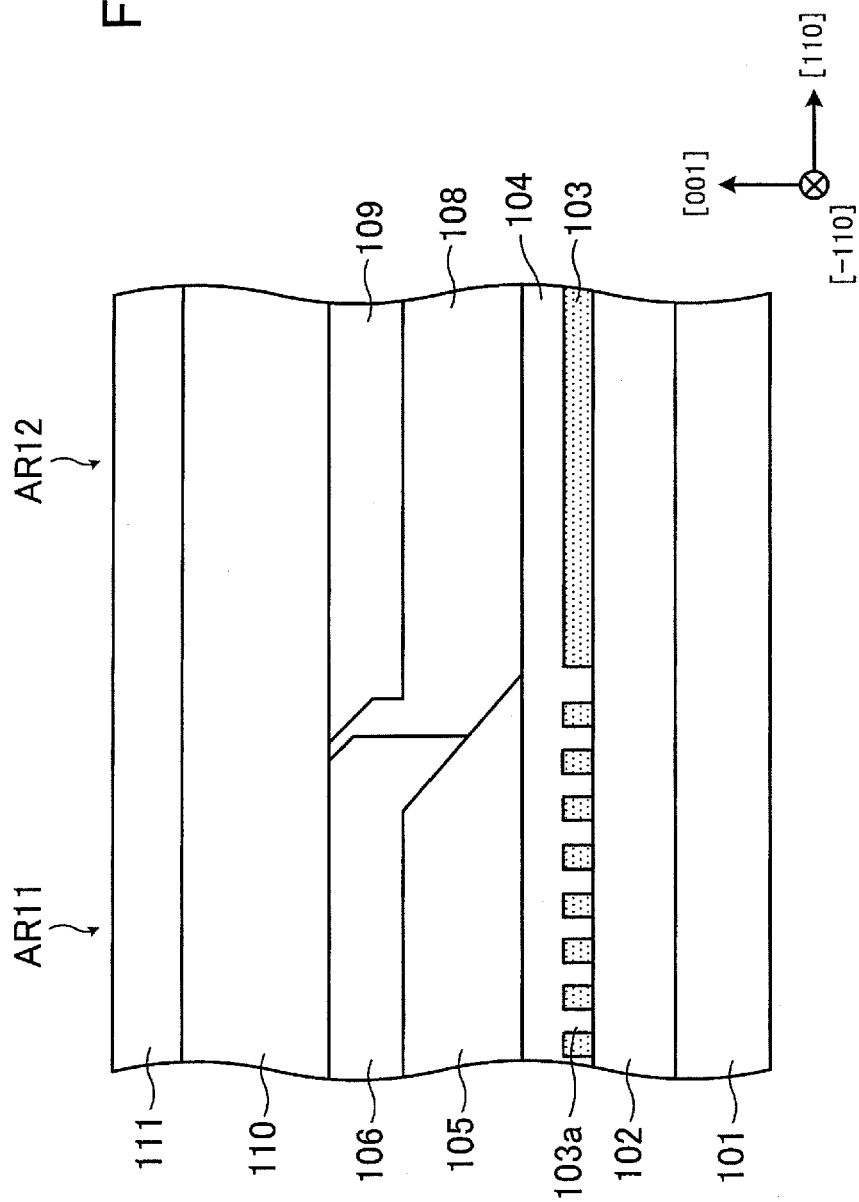
FIG. 13 is a fragmentary schematic sectional view of a third semiconductor growth step in the first embodiment.

FIG. 13 is a fragmentary schematic sectional view of a third semiconductor growth step in the first embodiment.

After the basic structure of the laser and the basic structure of the modulator are formed in the way illustrated in FIGS. 7 through 12, first the dielectric mask 107 is removed. A determined semiconductor layer is then made to grow.

First a p-InP clad layer 110 with a carrier concentration of $1\times10^{18}$ cm$^{-3}$ and a thickness of 1.5 μm is made to grow over the substrate from which the dielectric mask 107 has been removed. An p-InGaAs contact layer 111 with a carrier concentration of $1\times10^{19}$ cm$^{-3}$ and a thickness of 0.5 μm is then made to grow.

Figure 14:
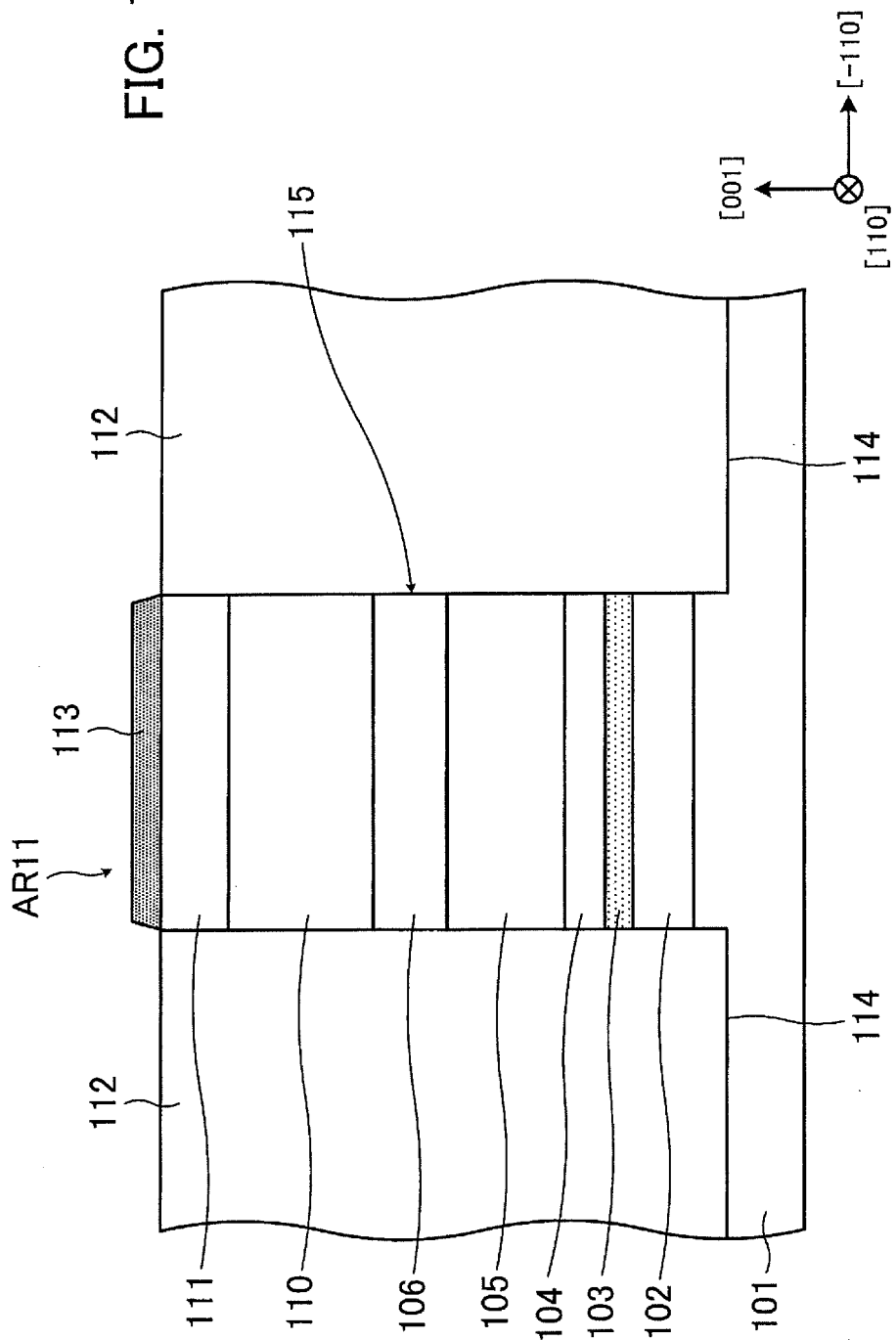
FIG. 14 is a fragmentary schematic sectional view of a buried layer formation step in the first embodiment.

FIG. 14 is a fragmentary schematic sectional view of a buried layer formation step in the first embodiment. FIG. 14 is a schematic sectional view of the laser region AR11 from the (110) orientation.

After the p-InP clad layer 110 and the p-InGaAs contact layer 111 are formed, a buried layer 112 is formed.

In order to form the buried layer 112, first a mask 113 with a width of 1.5 μm which extends in the (110) orientation so as to cover regions corresponding to the basic structure of the laser and the basic structure of the modulator (laser region AR11 and the modulator region AR12) is formed. A plurality of masks 113 may be formed like stripes (not illustrated for convenience).

After the mask 113 is formed, dry etching is performed in order to form a groove 114 which reaches the n-InP (001) substrate 101 and to form a mesa 115 which is 3 μm in height. An InP layer doped with iron (Fe) is then buried on both sides of the mesa 115 to form a buried layer 112 illustrated in FIG. 14.

Figure 15:
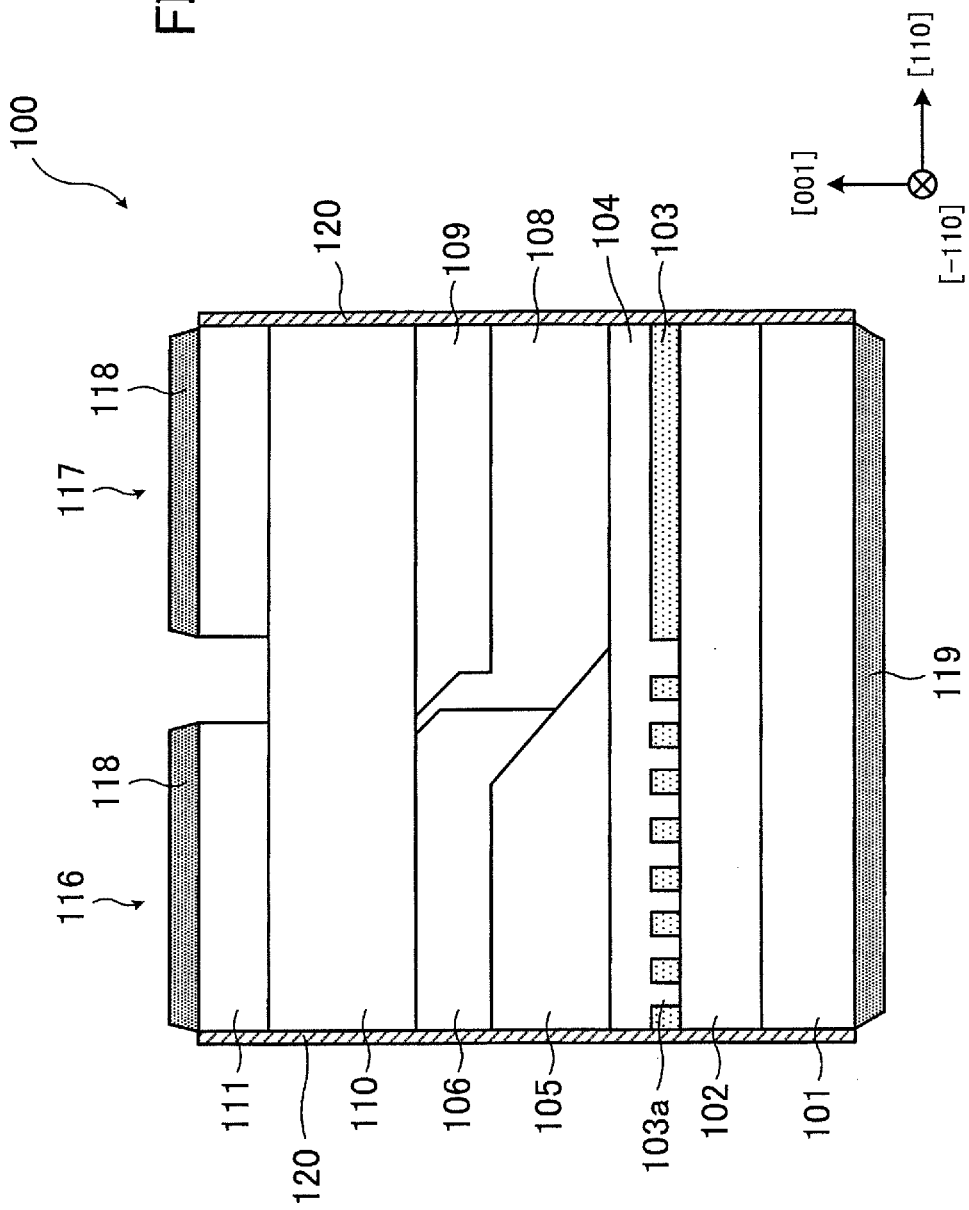
FIG. 15 is a fragmentary schematic sectional view of a semiconductor optical integrated device according to the first embodiment.

FIG. 15 is a fragmentary schematic sectional view of a semiconductor optical integrated device according to the first embodiment.

After the buried layer 112 is formed, the p-InGaAs contact layer 111 is separated into the p-InGaAs contact layer 111 on a laser 116 side and the p-InGaAs contact layer 111 on a modulator 117 side and a p-side electrode 118 is formed over each p-InGaAs contact layer 111. Alternatively, a p-side electrode 118 is formed over the p-InGaAs contact layer 111 and then the p-side electrode 118 and the p-InGaAs contact layer 111 are separated. An n-side electrode 119 is formed on the back of the n-InP (001) substrate 101. After that, cleavage is performed at the ends of the laser 116 and the modulator 117 (at positions by which a length of 600 μm is obtained in a direction in which light travels) and an antireflection coating 120 is formed on ends of the laser 116 and the modulator 117. By doing so, a modulator-integrated laser 100 illustrated in FIG. 15 is fabricated.

If in the step illustrated in FIG. 14, a plurality of masks 113 are formed like stripes, a plurality of mesas 115 are formed like stripes, and buried layers 112 are formed between mesas 115, then an array of modulator-integrated lasers 100 is obtained by the above cleavage. In this case, an antireflection coating 120 is formed on ends of each laser 116 and each modulator 117 after the cleavage and then the array is cleaved further into chips each including a determined number of modulator-integrated lasers 100.

A second embodiment will now be described.

Description will be given with a distributed reflector (DR) laser (semiconductor optical integrated device) in which a distributed feedback (DFB) laser (semiconductor optical device) and a distributed Bragg reflector (DBR) (semiconductor optical device) are integrated as an example. Such a DR laser will now be described in order of fabrication step.

Figure 16:
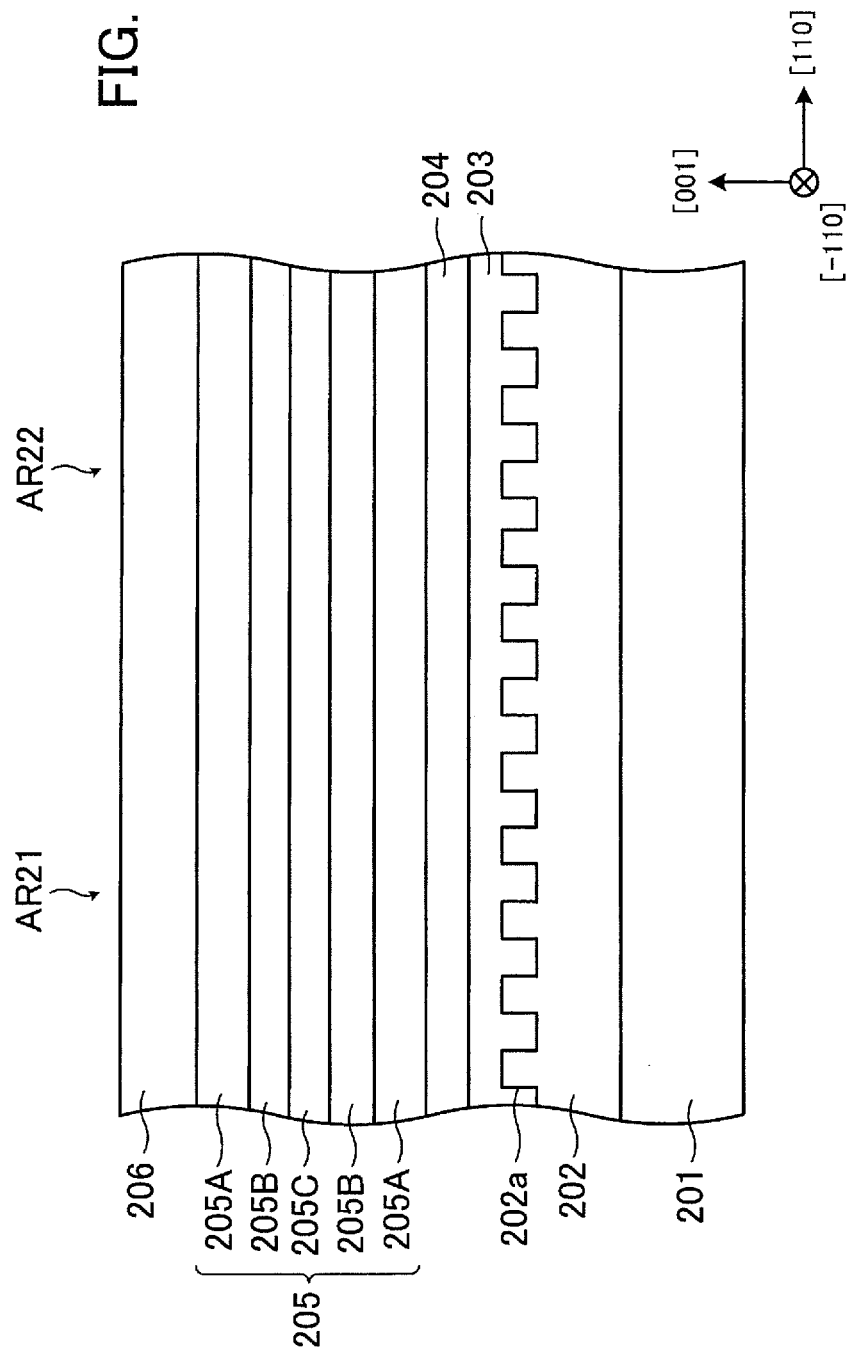
FIG. 16 is a fragmentary schematic sectional view of a first semiconductor growth step in a second embodiment.

FIG. 16 is a fragmentary schematic sectional view of a first semiconductor growth step in a second embodiment.

First a semiconductor layer in which a DFB laser is to be formed is formed over an n-InP (001) substrate 201. This semiconductor layer can be made to grow by the use of the MOVPE method.

First an n-InP buffer layer 202 with a carrier concentration of $5\times10^{17}$ cm$^{-3}$ and a thickness of 300 nm is made to grow over the n-InP (001) substrate 201 at a growth temperature of 630° C. Resist coating, electron beam exposure, development, and etching are then performed in order to form a diffraction grating 202a at a pitch of 200 nm and a depth of 50 nm in the n-InP buffer layer 202 in a DFB laser region AR21 and a DBR region AR 22. After that, the temperature is raised again to a growth temperature of 630° C. In order to bury the diffraction grating 202a formed in the n-InP buffer layer 202, an n-InGaAsP layer 203 with a carrier concentration of $5\times10^{17}$ cm$^{-3}$ and a composition wavelength of 1.1 μm is made to grow. An n-InP spacer layer 204 with a thickness of 20 nm is then made to grow over the n-InGaAsP layer 203.

An AlGaInAs separate confinement heterostructure 205A with a composition wavelength of 1.1 μm and a thickness of 30 nm is then made to grow. In order to form an AlGaInAs multiquantum well layer, an AlGaInAs barrier layer 205B with a composition wavelength of 1.1 μm and a thickness of 10 nm and an AlGaInAs well layer 205C with a composition wavelength of 1.1 μm and a thickness of 5 nm are then repeatedly (total of five cycles, for example) made to grow. In addition, an AlGaInAs separate confinement heterostructure 205A with a composition wavelength of 1.1 μm and a thickness of 30 nm is made to grow. By doing so, an AlGaInAs core layer 205 is formed.

A p-InP clad layer 206 with a carrier concentration of $5\times10^{17}$ cm$^{-3}$ and a thickness of 200 nm is then made to grow over the AlGaInAs core layer 205.

Figure 17:
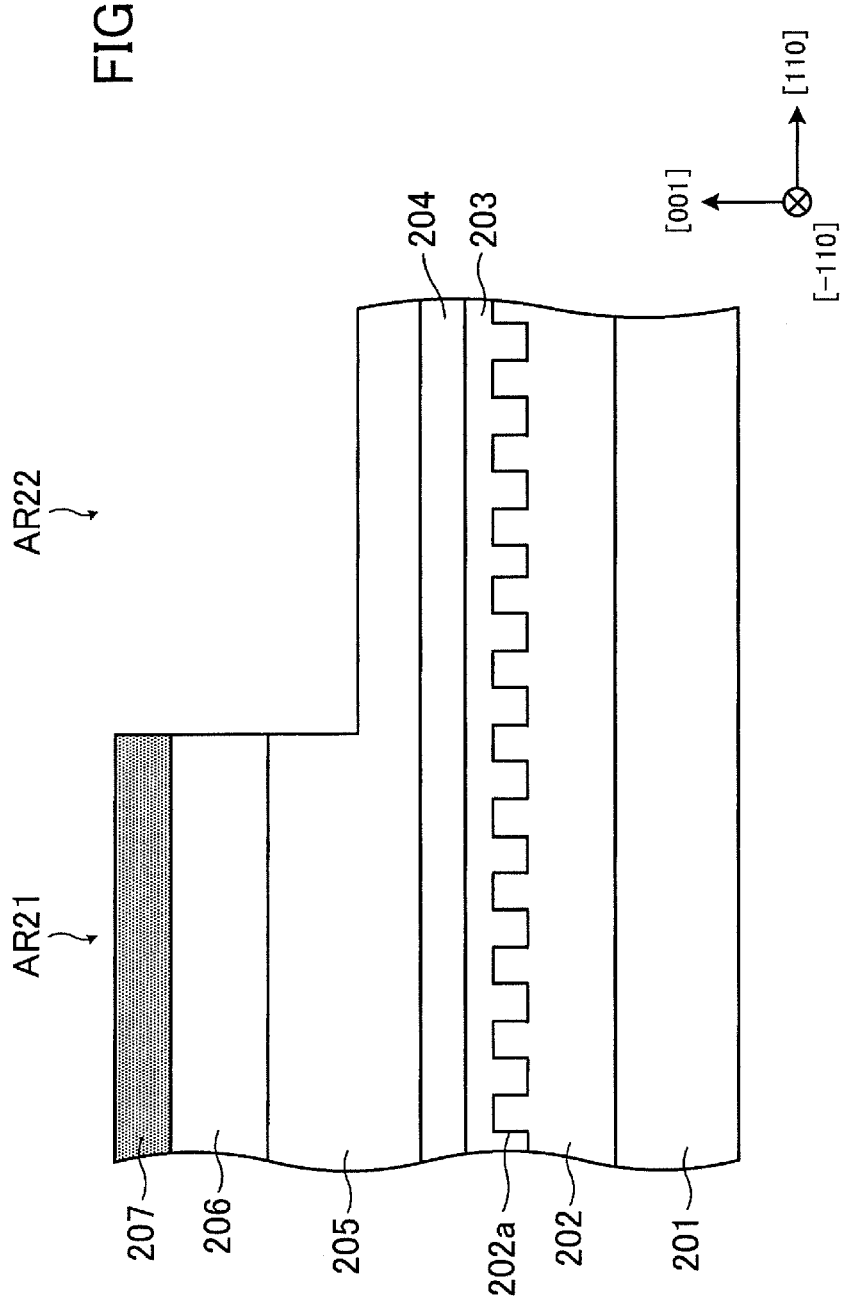
FIG. 17 is a fragmentary schematic sectional view of a first etching step in the second embodiment.

FIG. 17 is a fragmentary schematic sectional view of a first etching step in the second embodiment.

After each semiconductor layer is formed as illustrated in FIG. 16, dielectric masks 207 of SiO$_2$ or the like are formed in the DFB laser region AR21. Each dielectric mask 207 extends in a (110) orientation and has the shape of a pattern which is 20 μm in width and 300 μm in length. The dielectric masks 207 are formed in the (110) orientation at intervals of 100 μm.

Dry etching is then performed in the DBR region AR22 with the dielectric masks 207 as a mask. In this case, the p-InP clad layer 206 and the AlGaInAs core layer 205 in the DBR region AR22 are etched to a part of the AlGaInAs core layer 205 (to a depth of about 270 nm, for example).

Figure 18:
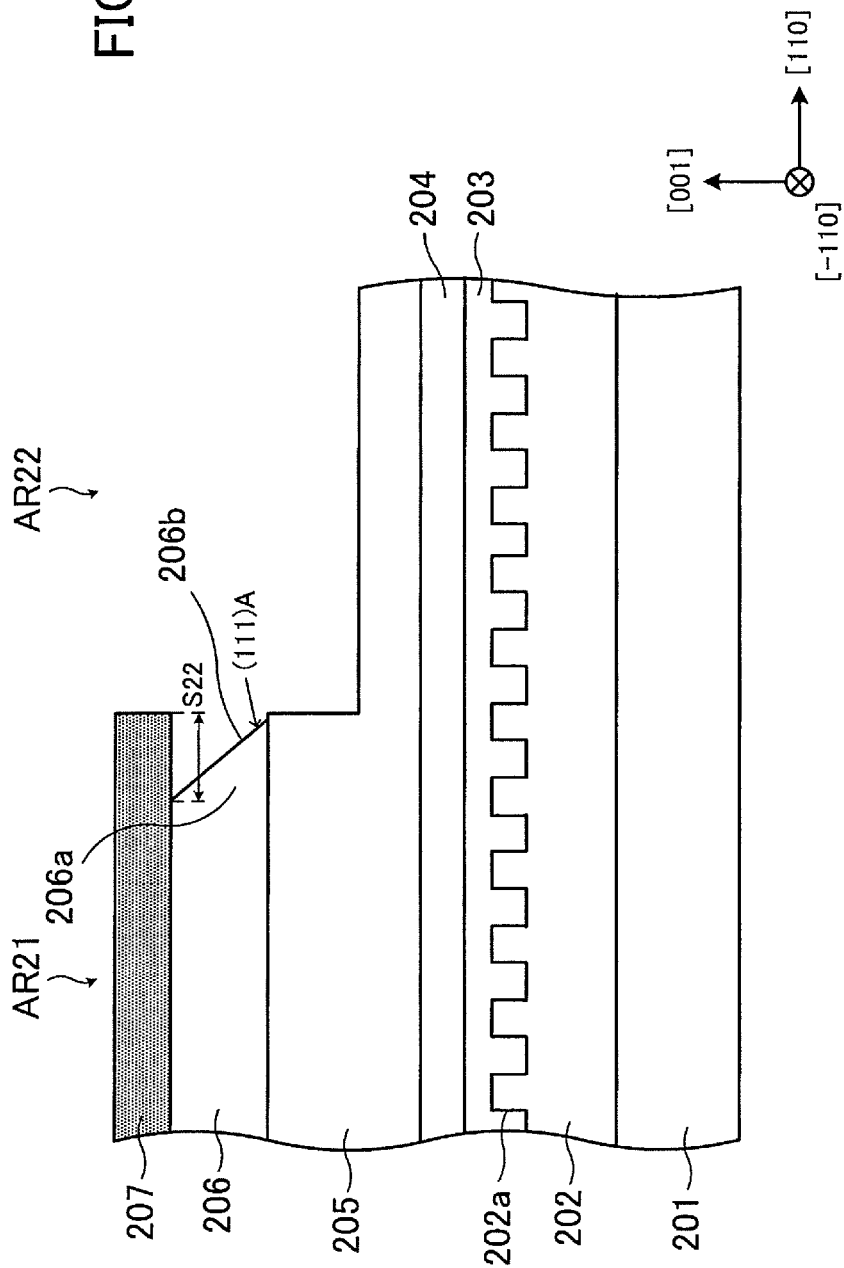
FIG. 18 is a fragmentary schematic sectional view of a second etching step in the second embodiment.

FIG. 18 is a fragmentary schematic sectional view of a second etching step in the second embodiment.

After the etching illustrated in FIG. 17 is performed, the p-InP clad layer 206 is wet-etched. The p-InP clad layer 206 is selectively etched by the use of a Br-based etchant. The p-InP clad layer 206 is side-etched by this etching so that an amount S22 by which an end portion 206a of the p-InP clad layer 206 is side-etched will become about 130 nm. At this time a (111) A plane appears on an end 206b of the p-InP clad layer 206.

Furthermore, a penthouse of the dielectric mask 107 is formed over the p-InP clad layer 206 as a result of this side etching. This penthouse of the dielectric mask 107 prevents a semiconductor which is to be made to form later from growing onto the dielectric mask 207.

Figure 19:
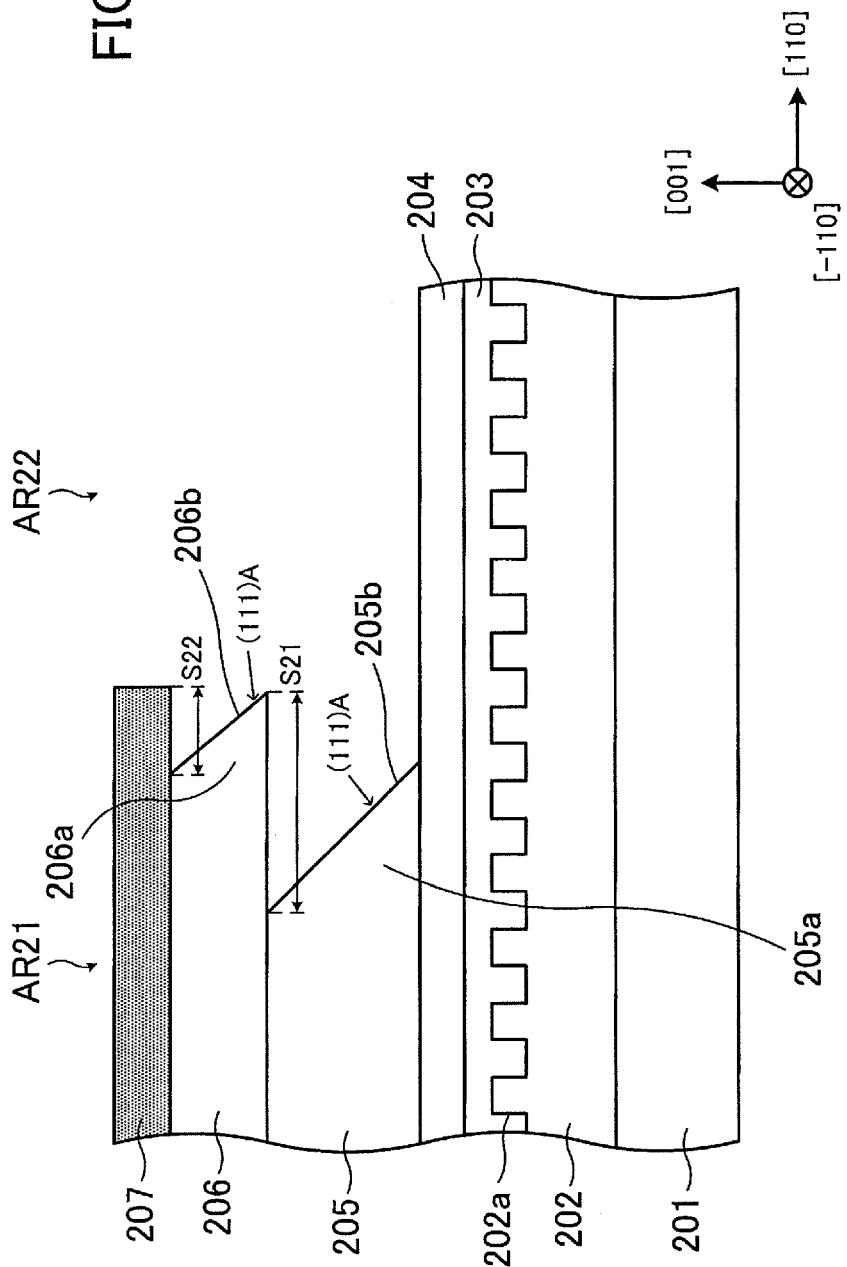
FIG. 19 is a fragmentary schematic sectional view of a third etching step in the second embodiment.

FIG. 19 is a fragmentary schematic sectional view of a third etching step in the second embodiment.

After the p-InP clad layer 206 is side-etched, the AlGaInAs core layer 205 is wet-etched. The AlGaInAs core layer 205 is selectively etched by the use of a solution of dilute sulfuric acid and hydrogen peroxide water as an etchant. The AlGaInAs core layer 205 is side-etched by this etching so that an amount S21 by which an end portion 205a of the AlGaInAs core layer 205 is side-etched will become about 400 nm. At this time a (111) A plane appears on an end 205b of the AlGaInAs core layer 205.

The n-InP spacer layer 204 under the AlGaInAs core layer 205 gets exposed in the DBR region AR22. By properly setting conditions under which the AlGaInAs core layer 205 is wet-etched, it is possible to control etching of the n-InP spacer layer 204, selectively etch the AlGaInAs core layer 205, and set the side etching amount S21 to a determined value.

Figure 20:
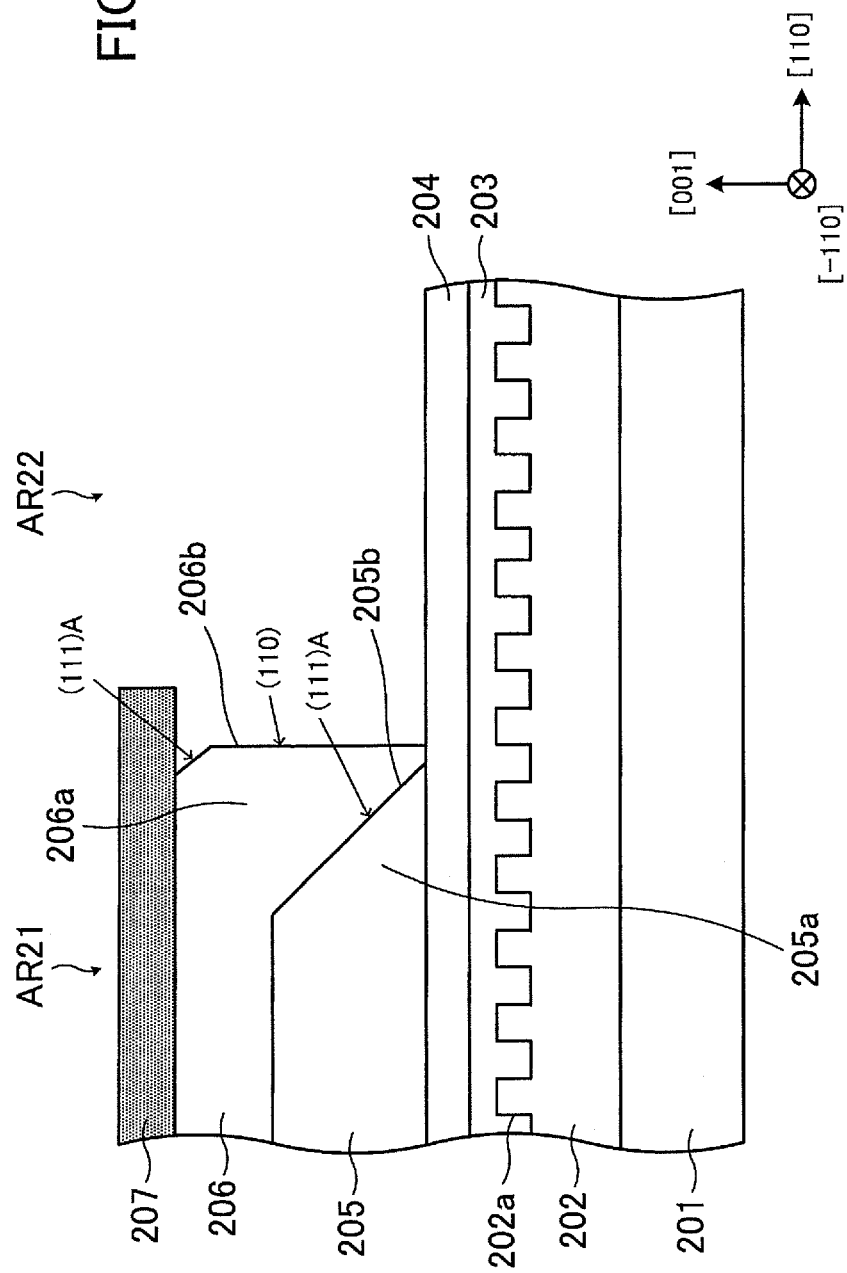
FIG. 20 is a fragmentary schematic sectional view of a heat treatment step in the second embodiment.

FIG. 20 is a fragmentary schematic sectional view of a heat treatment step in the second embodiment.

After the p-InP clad layer 206 and the AlGaInAs core layer 205 are wet-etched, heat treatment is performed to cause mass transport in the end portion 206a of the p-InP clad layer 206.

For example, the substrate after the wet etching is set in a reactor of a MOVPE system and its temperature is raised to 690° C. in an atmosphere of $PH_3$. At this time mass transport of InP occurs. For example, as illustrated in FIG. 20, the (111) A plane remains in an upper part of the end portion 206a of the p-InP clad layer 206 and a (110) plane which forms an angle of 90° with a (001) plane appears in a lower part of the end portion 206a of the p-InP clad layer 206. The whole of the (111) A plane on the end 205b of the AlGaInAs core layer 205 is covered with the end portion 206a of the p-InP clad layer 206 after the mass transport.

This shape of a side of the p-InP clad layer 206 can be obtained by setting an amount by which the p-InP clad layer 206 protrudes from the AlGaInAs core layer 205 to a relatively great value in the above side etching and causing sufficient mass transport by the heat treatment.

Figure 21:
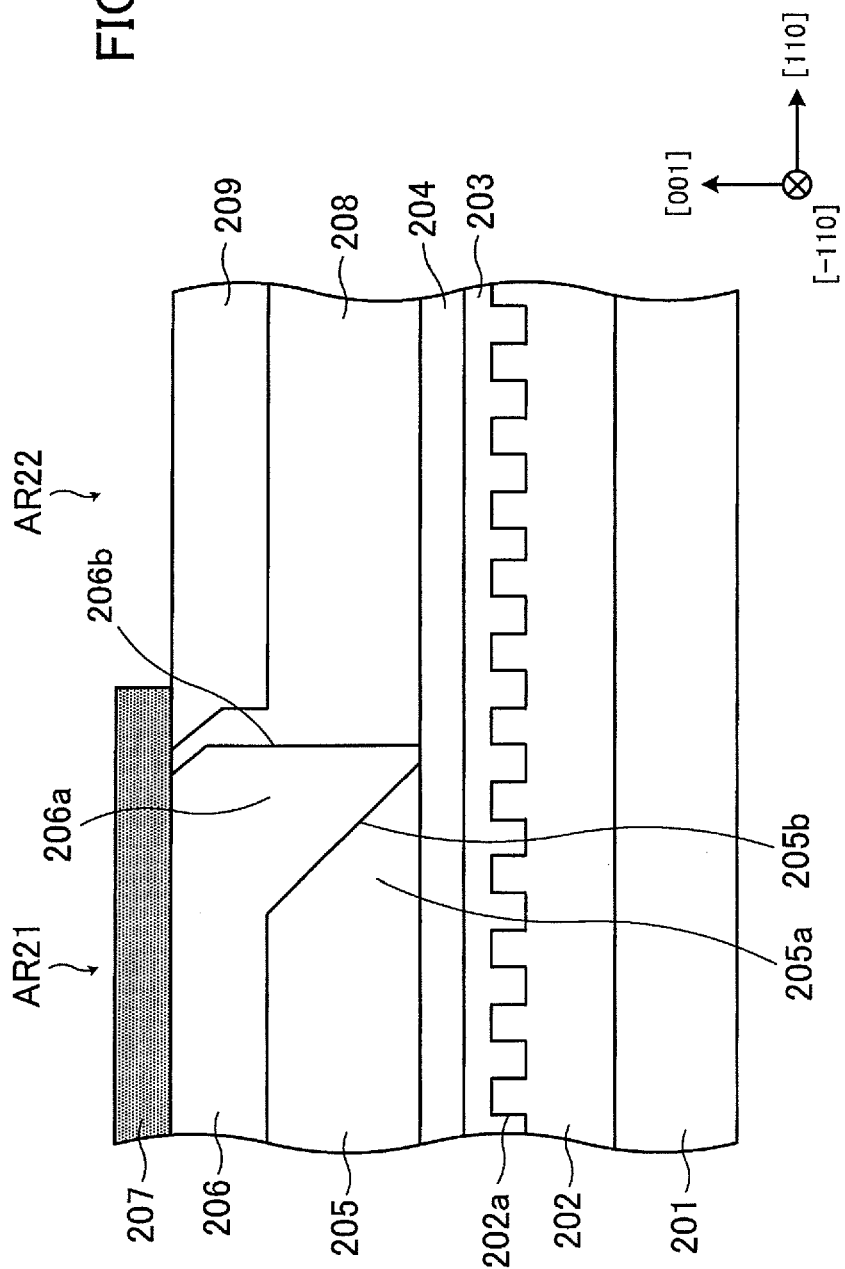
FIG. 21 is a fragmentary schematic sectional view of a second semiconductor growth step in the second embodiment.

FIG. 21 is a fragmentary schematic sectional view of a second semiconductor growth step in the second embodiment.

After the mass transport is caused in the end portion 206a of the p-InP clad layer 206 by the heat treatment, an AlGaInAs waveguide layer 208 with a composition wavelength of 1.2 µm and a thickness of 145 nm and a nondope i-InP clad layer 209 are made to grow in the DBR region AR22.

When the AlGaInAs waveguide layer 208 is made to grow, crystal surfaces which are exposed on the sides on the DFB laser region AR21 side are the (111) A plane and the (110) plane. Accordingly, the impact of growth surfaces can be avoided and the occurrence of a stacking fault or the like can be controlled. Furthermore, this makes it possible to form the i-InP clad layer 209 in which the occurrence of a stacking fault or the like is controlled.

At this time the AlGaInAs waveguide layer 208 and the i-InP clad layer 209 can be made to grow in a region below the dielectric mask 207 by the dielectric mask 207.

Furthermore, the heat treatment which causes mass transport in the end portion 206a of the above p-InP clad layer 206 can be used as a temperature rise step and a temperature maintenance step before the beginning of the growth of the AlGaInAs waveguide layer 208 (before the introduction of materials).

By performing the above steps illustrated in FIGS. 16 through 21, a structure (BJ structure) in which a basic structure of a DFB laser and a basic structure of a DBR are joined together in a state in which they are arranged in the (110) orientation and in which they are optically connected is obtained over the n-InP (001) substrate 201.

Figure 22:
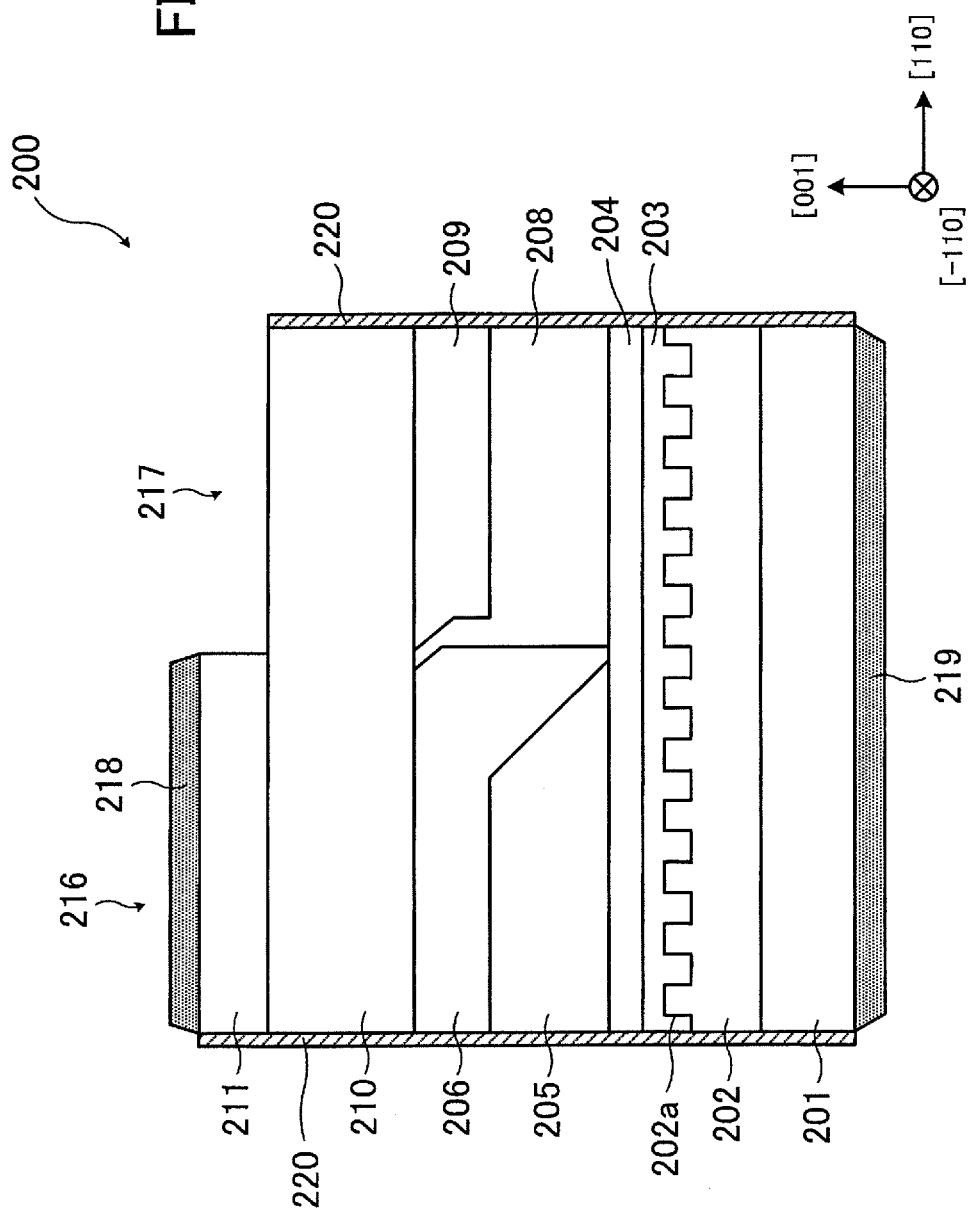
FIG. 22 is a fragmentary schematic sectional view of a semiconductor optical integrated device according to the second embodiment.

FIG. 22 is a fragmentary schematic sectional view of a semiconductor optical integrated device according to the second embodiment.

After the basic structure of the DFB laser and the basic structure of the DBR are formed in the way illustrated in FIGS. 16 through 21, the dielectric mask 207 is removed. First a p-InP clad layer 210 with a carrier concentration of $1 \times 10^{18}$ $cm^{-3}$ and a thickness of 1.5 µm is made to grow. A p-InGaAs contact layer 211 with a carrier concentration of $1 \times 10^{19}$ $cm^{-3}$ and a thickness of 0.5 µm is then made to grow.

One or more masks with a width of 1.5 µm which extend in the (110) orientation so as to cover regions corresponding to the basic structure of the DFB laser and the basic structure of the DBR are then formed like stripes. Dry etching is performed to form a mesa which is 3 µm in height. An InP layer doped with Fe is buried on both sides of the mesa. This is the same with the above first embodiment.

After that, patterning for leaving the p-InGaAs contact layer 211 on the DFB laser 216 side and the formation of a p-side electrode 218 and an n-side electrode 219 are performed. Cleavage is then performed at the ends of the DFB laser 216 and a DBR 217 (at positions by which a length of 200 µm is obtained in a direction in which light travels) and an antireflection coating 220 is formed on ends of the DFB laser 216 and the DBR 217. By doing so, a DR laser 200 illustrated in FIG. 22 is fabricated.

If an array including a plurality of DR lasers 200 is obtained by the above cleavage, an antireflection coating 220 is formed on ends of each DFB laser 216 and each DBR 217 after the cleavage and then the array is cleaved further into chips each including a determined number of DR lasers 200.

Furthermore, in the above example the AlGaInAs waveguide layer 208 is formed. However, a GaInAsP waveguide layer may be formed in place of the AlGaInAs waveguide layer 208.

The first embodiment and the second embodiment have been described.

In the above first embodiment or second embodiment, as illustrated in FIG. 11 or 20, the (111) A plane remains in the upper part of the end portion 106a or 206a of the p-InP clad layer 106 or 206 and the (110) plane which forms an angle of 90° with the (001) plane appears in the lower part of the end portion 106a or 206a of the p-InP clad layer 106 or 206. In addition to the (110) plane, a crystal surface which forms an angle that is greater than or equal to 55° and less than 90° with the (001) plane may appear on the side of the p-InP clad layer 106 or 206.

Figure 23:
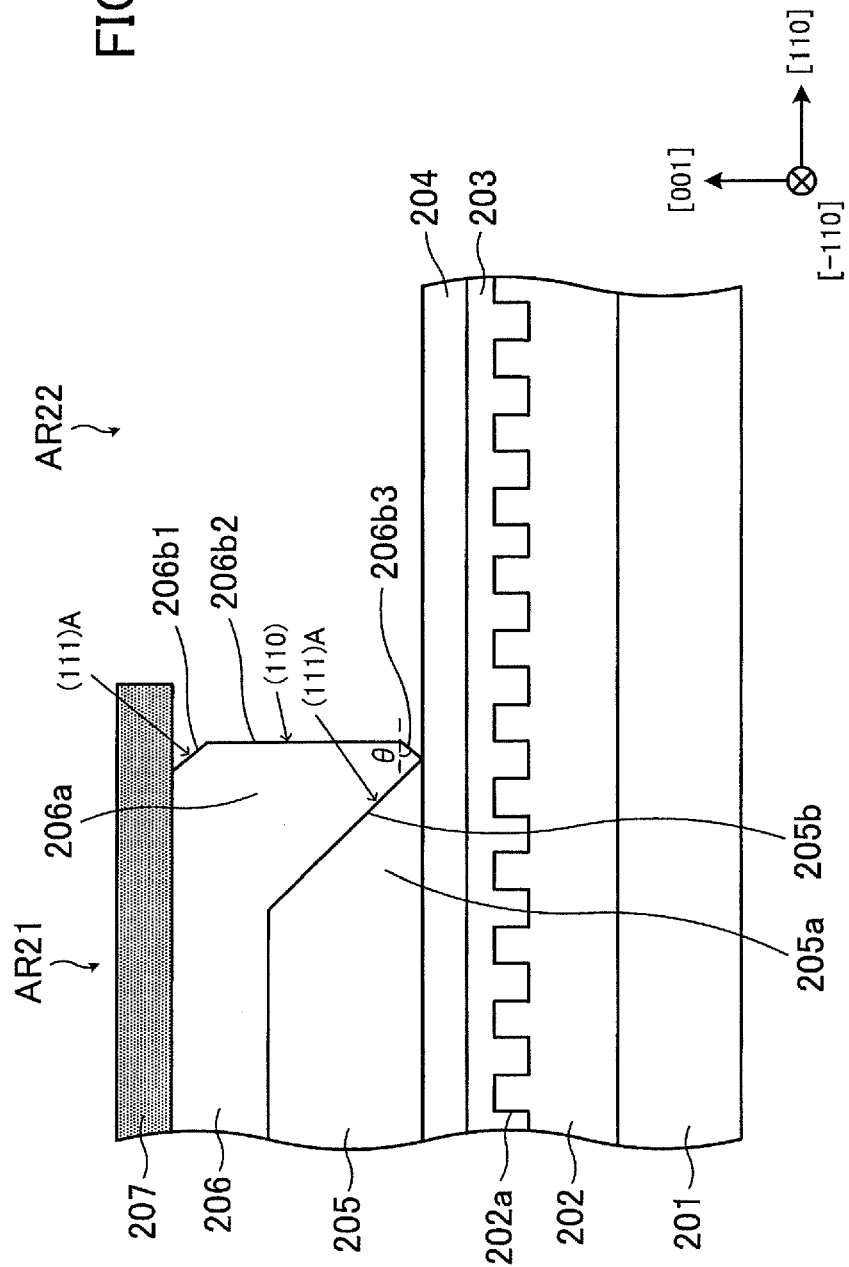
FIG. 23 is a fragmentary schematic sectional view of another example of a heat treatment step in the second embodiment.

FIG. 23 is a fragmentary schematic sectional view of another example of a heat treatment step in the above second embodiment.

Heat treatment after the side etching causes mass transport of InP. As a result, the shape of the side of the p-InP clad layer 206 illustrated in FIG. 23 can be obtained. That is to say, in the example of FIG. 23 the (111) A plane remains on an upper end 206b1 and a (110) plane is formed on a middle end 206b2, as a result of mass transport of InP. In addition, a crystal surface which forms an angle θ that is greater than or equal to 55° and less than 90° with the (001) plane is formed on a lower end 206b3.

Even if such a crystal surface appears after the heat treatment, the impact of growth surfaces can be controlled, as described above, at the time of the following regrowth (BJ growth). Therefore, the occurrence of a trouble, such as a stacking fault, in a BJ portion can be controlled.

The same applies to the above first embodiment. The side of the p-InP clad layer 106 may have the following shape after the heat treatment. That is to say, an upper end is the (111)A plane, a middle end is the (110) plane and a lower end is a crystal surface which forms an angle θ that is greater than or equal to 55° and less than 90° with the (001) plane. As a result, the occurrence of a trouble, such as a stacking fault, in a BJ portion can be controlled.

Furthermore, in the above first or second embodiment a semiconductor optical integrated device having a BJ structure in which two functional devices are arranged in the (110) orientation and in which they are joined together is taken as an example. That is to say, a semiconductor optical integrated device including one BJ portion is taken as an example. However, the above technique can also be applied to a semiconductor optical integrated device including a plurality of BJ portions.

Figure 24:
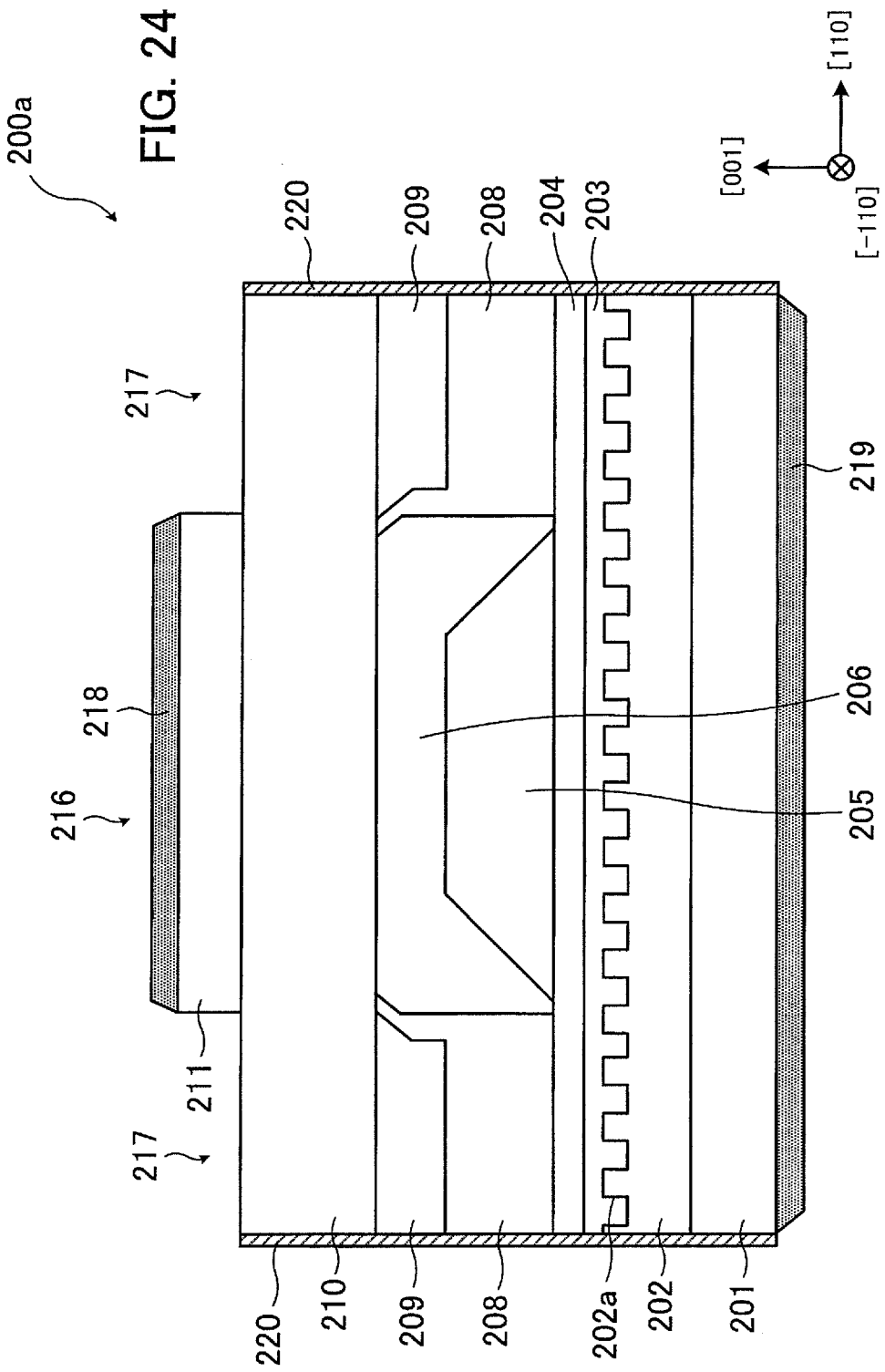
FIG. 24 is an example of the structure of a modification of a semiconductor optical integrated device.

FIG. 24 is an example of the structure of such a semiconductor optical integrated device.

In FIG. 24, a DR laser 200a is taken as an example of a semiconductor optical integrated device. With the DR laser 200a DBRs 217 are formed on both sides of a DFB laser 216. That is to say, the DBRs 217 are formed at input end and output end of the DFB laser 216. These three devices, that is to say, the DBR 217, the DFB laser 216, and the DBR 217 are arranged in the (110) orientation and are formed.

This DR laser 200a can be fabricated in accordance with the steps in the above second embodiment. In the etching steps illustrated in FIGS. 17 through 19, for example, etching is performed in DBR regions AR22 which are arranged in the (110) orientation and between which a DFB laser region AR21 is. In the step illustrated in FIG. 20, heat treatment is then performed so that both sides in the (110) orientation in the DFB laser region AR21 will have shapes by which determined crystal surfaces appear. After that, regrowth is performed in the DBR regions AR22. A p-InP clad layer 210, a p-InGaAs contact layer 211, a p-side electrode 218, an n-side electrode 219, and an antireflection coating 220 are then formed. This is the same with the above second embodiment.

The DR laser 200a illustrated in FIG. 24 includes two BJ portions (on both sides of the DFB laser 216). Even in such a case, the occurrence of a trouble, such as a stacking fault, in a BJ portion can be controlled by adopting the above technique.

Furthermore, in the above first or second embodiment the AlGaInAs core layer 105 or 205 including the multiquantum well layer is formed. However, a core layer using a bulk structure, a quantum wire structure, or a quantum dot structure can be formed.

In addition, in the above first or second embodiment the n-InP (001) substrate 101 or 201 is used. However, a p-type substrate or a semi-insulating (SI) substrate can be used. If a p-type substrate or an SI substrate is used, the structure of an n-layer formed under a core layer, the placement of an electrode, or the like is arbitrarily changed so that carriers can be supplied to the n-layer.

Furthermore, an optical semiconductor module can be formed by combining the semiconductor optical integrated device described in the above first or second embodiment and another device.

FIG. 25 illustrates as an example an optical semiconductor module using the DR laser 200 described in the above second embodiment.

With an optical semiconductor module 300 illustrated in FIG. 25, the DR laser 200 is mounted on a coaxial package 302 having lead pins 301. In addition, a light receiving element 303 for back monitor is set on the back end side of the DR laser 200. Each lead pin is connected to the DR laser 200 or the light receiving element 303.

The lead pin 301 connected to the DR laser 200 is connected to an electrical signal source for driving the DFB laser. On the other hand, the lead pin 301 connected to the light receiving element 303 is connected to a monitor for monitoring an output of the DR laser 200.

The DR laser 200 and the light receiving element 303 are covered with a cap 305 on which a lens 304 is fixed. The lens 304 functions as an optical output port for condensing laser light (signal light) outputted from a front end of the DR laser 200 and inputting it to an optical fiber placed beyond the lens 304.

The above optical semiconductor module 300 does not include a thermoelectric cooling element for adjusting the temperature of the DR laser 200. The reason for this is as follows. The DR laser 200 includes an AlGaInAs-based active layer, so the DR laser 200 oscillates in single longitudinal mode in a wide temperature range.

The optical semiconductor module including the DR laser is taken as an example. However, optical semiconductor modules corresponding to different uses can be formed by combining various semiconductor optical integrated devices, such as a modulator-integrated laser, and other devices.

According to the disclosed semiconductor optical integrated device, a crystal defect or abnormal growth in a portion between semiconductor optical devices is controlled and its reliability and performance are improved.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A method for fabricating a semiconductor optical integrated device, the method comprising:
    forming a first core layer over a (001) plane of a substrate;
    forming a first clad layer over the first core layer;
    leaving the first core layer and the first clad layer formed in a first region and etching the first core layer and the first clad layer formed in a second region which is in a (110) orientation from the first region;
    after the etching of the first core layer and the first clad layer formed in the second region, forming a first crystal surface on a side on a second region side of the first clad layer which remains in the first region, the first crystal surface forming an angle which is greater than or equal to 55 degrees and less than or equal to 90 degrees with a (001) plane;
    after the forming of the first crystal surface, forming a second core layer in the second region, the second core layer being optically connected to the first core layer which remains in the first region; and
    forming a second clad layer over the second core layer in the second region; wherein
    a part of the second core layer is formed between the first clad layer which remains in the first region and the second clad layer formed in the second region.

2. The method according to claim 1, wherein the forming of the first crystal surface includes performing heat treatment on the first clad layer which remains in the first region.

3. The method according to claim 2, wherein the first crystal surface includes at least a (110) plane on a side on the second region side of the first clad layer which remains in the first region due to the heat treatment.

4. The method according to claim 1, wherein the etching of the first core layer and the first clad layer formed in the second region includes side-etching the first core layer and the first clad layer toward a first region side.

5. The method according to claim 1, wherein the forming of the second core layer includes forming the second core layer so that the second core layer covers both a whole side on the second region side of the first core layer which remains in the first region and a whole side on the second region side of the first clad layer which remains in the first region.

\* \* \* \* \*